United States Patent
Park et al.

(10) Patent No.: US 9,786,764 B2
(45) Date of Patent: Oct. 10, 2017

(54) FIN-FET SEMICONDUCTOR DEVICE WITH A SOURCE/DRAIN CONTACT HAVING VARYING DIFFERENT WIDTHS

(71) Applicant: Samsung Electronics Co., Ltd., Suwon-si (KR)

(72) Inventors: Chan-Jin Park, Yongin-si (KR); Chung-Hwan Shin, Seoul (KR); Sung-Woo Kang, Suwon-si (KR); Young-Mook Oh, Hwaseong-si (KR); Sun-Jung Lee, Hwaseong-si (KR); Jeong-Nam Han, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/920,267

(22) Filed: Oct. 22, 2015

(65) Prior Publication Data

US 2016/0141417 A1    May 19, 2016

(30) Foreign Application Priority Data

Nov. 19, 2014   (KR) .................. 10-2014-0161943

(51) Int. Cl.
*H01L 29/66*   (2006.01)
*H01L 29/78*   (2006.01)
(Continued)

(52) U.S. Cl.
CPC .. *H01L 29/66545* (2013.01); *H01L 21/76816* (2013.01); *H01L 21/76831* (2013.01);
(Continued)

(58) Field of Classification Search
CPC .................. H01L 23/52–23/5389; H01L 21/768–21/76898
See application file for complete search history.

(56) References Cited

U.S. PATENT DOCUMENTS 6,165,839 A   12/2000  Lee et al.
6,825,112 B2  11/2004  Ando
(Continued)

FOREIGN PATENT DOCUMENTS

JP    2008-226919 A   9/2008
KR    10-0248143 B1  12/1999
(Continued)

*Primary Examiner* — Charles Garber
*Assistant Examiner* — Brigitte Paterson
(74) *Attorney, Agent, or Firm* — Muir Patent Law, PLLC

(57) ABSTRACT

A semiconductor device includes an active fin formed to extend in a first direction, a gate formed on the active fin and extending in a second direction crossing the first direction, a source/drain formed on upper portions of the active fin and disposed at one side of the gate, an interlayer insulation layer covering the gate and the source/drain, a source/drain contact passing through the interlayer insulation layer to be connected to the source/drain and including a first contact region and a second contact region positioned between the source/drain and the first contact region, and a spacer layer formed between the first contact region and the interlayer insulation layer. A width of the second contact region in the first direction is greater than the sum of a width of the first contact region in the first direction and a width of the spacer layer in the first direction.

18 Claims, 33 Drawing Sheets

(51) Int. Cl.
*H01L 21/768* (2006.01)
*H01L 21/285* (2006.01)

(52) U.S. Cl.
CPC .... *H01L 29/66795* (2013.01); *H01L 29/7855* (2013.01); *H01L 21/28518* (2013.01); *H01L 2029/7858* (2013.01); *H01L 2221/1063* (2013.01)

(56) References Cited

U.S. PATENT DOCUMENTS

| | | | |
|---|---|---|---|
| 8,697,524 B2 | 4/2014 | You et al. | |
| 2010/0193888 A1 | 8/2010 | Gu et al. | |
| 2015/0076609 A1* | 3/2015 | Xie | H01L 29/785 257/365 |
| 2016/0035857 A1* | 2/2016 | Leobandung | H01L 29/665 257/288 |

FOREIGN PATENT DOCUMENTS

| | | |
|---|---|---|
| KR | 10-0248626 B1 | 12/1999 |
| KR | 10-0261328 B1 | 4/2000 |
| KR | 10-2001-0048581 A | 6/2001 |
| KR | 10-2001-0112754 A | 12/2001 |
| KR | 10-2006-0135214 A | 12/2006 |
| KR | 10-2007-0019270 A | 2/2007 |
| KR | 10-2009-0068016 A | 6/2009 |
| KR | 10-2010-0053856 A | 5/2010 |

\* cited by examiner

1200

US 9,786,764 B2

FIN-FET SEMICONDUCTOR DEVICE WITH A SOURCE/DRAIN CONTACT HAVING VARYING DIFFERENT WIDTHS

CROSS-REFERENCE TO RELATED APPLICATION

This application claims priority under 35 U.S.C. §119 to Korean Patent Application No. 10-2014-0161943 filed on Nov. 19, 2014 in the Korean Intellectual Property Office, the contents of which in its entirety are herein incorporated by reference.

BACKGROUND

1. Field of the Inventive Concept

The present disclosure relates to a semiconductor device and a method for fabricating the same.

2. Description of the Related Art

Certain scaling techniques for increasing the density of semiconductor devices use a multi gate transistor structure in which a silicon body shaped of a nanowire is formed on a substrate and a gate is formed on a surface of the silicon body.

Since the multi gate transistor structure uses a three-dimensional channel, scaling can be achieved. In addition, current controlling capability is typically improved by reducing a length of the gate. However, this may increase a short channel effect (SCE) in which a potential of a channel region is affected by drain voltage.

SUMMARY

The present disclosure provides a semiconductor device, which can prevent a short between a gate and a source/drain contact using a spacer layer in forming a source/drain contact and can secure a source/drain profile through high selectivity etching using an ion implantation process.

The present disclosure also provides a method for fabricating a semiconductor device, which can prevent a short between a gate and a source/drain contact using a spacer layer in forming a source/drain contact and can secure a source/drain profile through high selectivity etching using an ion implantation process.

According to aspects of the present inventive concept, there is provided a semiconductor device including an active fin formed to extend in a first direction, a gate formed on the active fin and extending in a second direction crossing the first direction, a source/drain formed on upper portions of the active fin and disposed at one side of the gate, an interlayer insulation layer covering the gate and the source/drain, a source/drain contact passing through the interlayer insulation layer to be connected to the source/drain and including a first contact region and a second contact region positioned between the source/drain and the first contact region, and a spacer layer formed between the first contact region and the interlayer insulation layer, wherein a width of the second contact region of the source/drain contact in the first direction is greater than the sum of a width of the first contact region of the source/drain contact in the first direction and a width of the spacer layer in the first direction.

According to aspects of the present inventive concept, there is provided a semiconductor device including an active fin formed to extend in a first direction, a gate formed on the active fin and extending in a second direction crossing the first direction, a source/drain formed on upper portions of the active fin and disposed at one side of the gate, an interlayer insulation layer covering the gate and the source/drain, a source/drain contact passing through the interlayer insulation layer to be connected to the source/drain and including a first contact portion and a second contact portion formed between the source/drain and the first contact portion, and a spacer formed between the first contact portion and the interlayer insulation layer, wherein the interlayer insulation layer includes a first part and a second part formed under the first part, wherein a first surface of the first part contacts a first surface of the spacer and a first surface of the second part contacts a first surface of the second contact portion, and wherein on the basis of a particular line perpendicular to a bottom surface of the interlayer insulation layer, a width of the first part in the first direction from the particular line to the first surface of the spacer is greater than a width of the second part in the first direction from the particular line to the first surface of the second contact portion.

According to aspects of the present inventive concept, there is provided a semiconductor device including first and second active fins protruding from a substrate to extend in a first direction and spaced apart from each other in a second direction crossing the first direction, a first source/drain formed on upper portions of the first active fin, a second source/drain formed on upper portions of the second active fin and having one side merged with one side of the first source/drain, a field insulation layer formed between the first and second active fins under the first and second sources/drains, an etch stop layer formed along bottom surfaces of the first and second sources/drains and a top surface of the field insulation layer, and an interlayer insulation layer formed on the etch stop layer, wherein a void is formed in a space surrounded by a portions of the etch stop layer formed along the bottom surfaces of the first and second sources/drains adjacent to each other and facing each other and the top surface of the field insulation layer.

According to aspects of the present inventive concept, there is provided a semiconductor device. The semiconductor device includes an active portion formed to extend in a first direction, a first gate structure formed on the active portion and extending in a second direction perpendicular to the first direction, a source/drain formed in the active portion and disposed at one side of the gate, an insulation layer covering the gate and the source/drain, a source/drain contact passing through the insulation layer to be connected to the source/drain and including a first contact region and a second contact region located under the first contact region, and a pair of spacers respectively formed along the opposite sidewalls of the first contact region. A bottom surface of the second contact region fully overlaps a bottom surface of each spacer of the pair of spacers.

BRIEF DESCRIPTION OF THE DRAWINGS

Exemplary embodiments of the present inventive concept will be more clearly understood from the following detailed description taken in conjunction with the attached drawings in which.

DETAILED DESCRIPTION OF THE EMBODIMENTS

Figure 1:
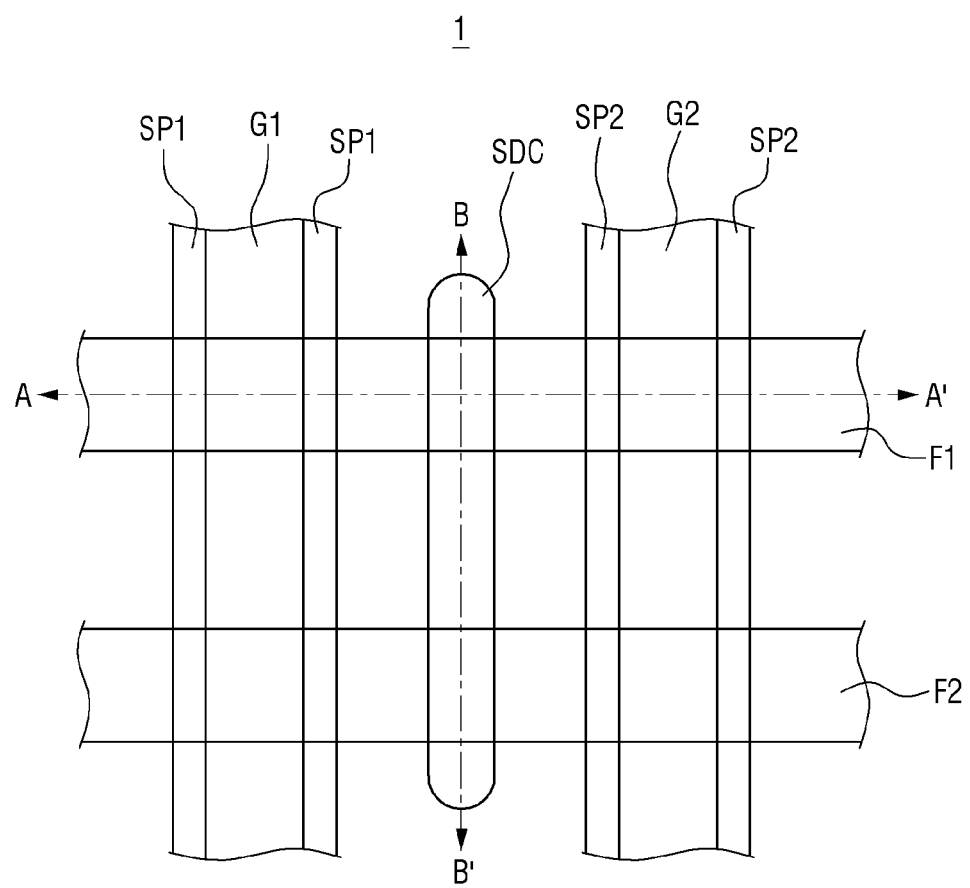
FIG. 1 is a plan view of a semiconductor device according to example embodiments of the present inventive concept.

Exemplary embodiments will be described in detail with reference to the accompanying drawings. The inventive concept, however, may be embodied in various different forms, and should not be construed as being limited only to the illustrated embodiments. Accordingly, known processes, elements, and techniques are not described with respect to some of the embodiments of the disclosure. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Expressions such as "at least one of," when preceding a list of elements, modify the entire list of elements and do not modify the individual elements of the list. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. The term "contact," as used herein, refers to a direct contact, unless indicated otherwise.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a semiconductor device according to example embodiments of the present inventive concept will be described with reference to FIGS. 1 to 5.

Figure 2A:
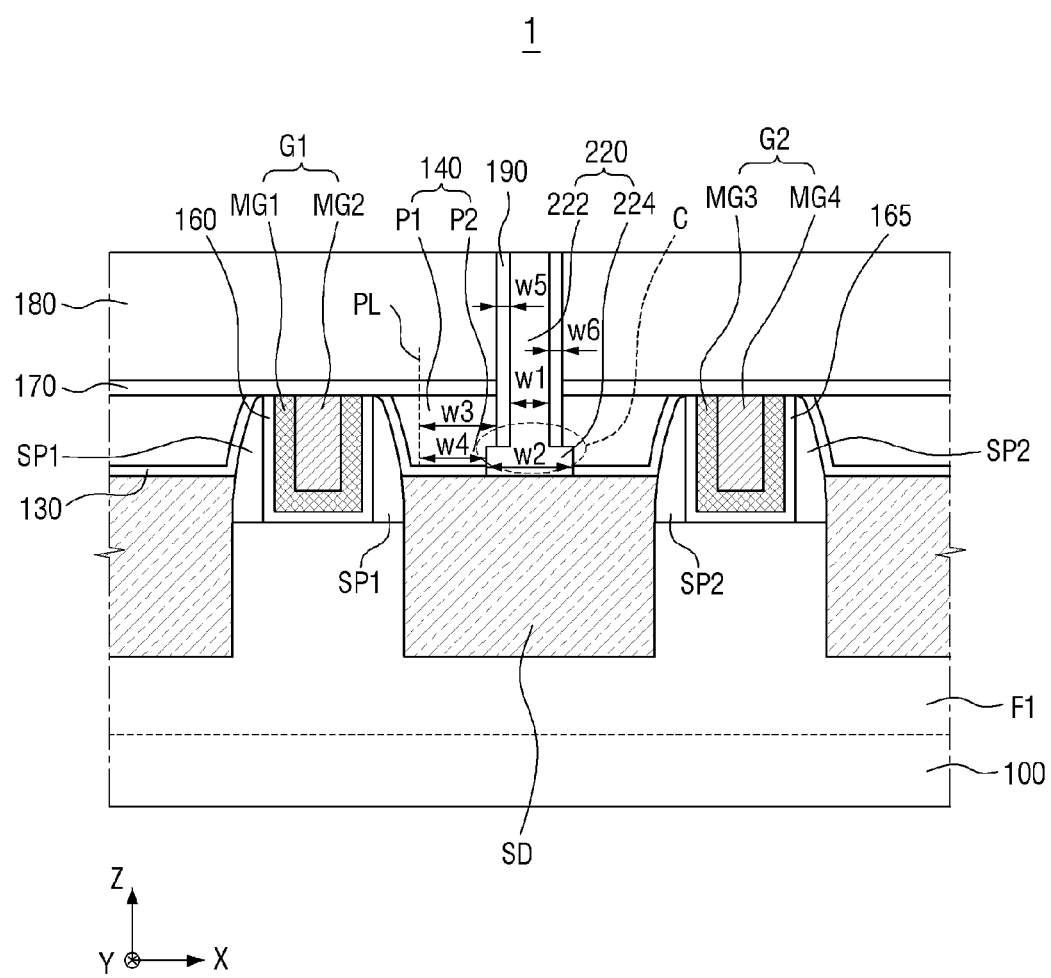
FIG. 2A is a cross-sectional view taken along the line AA' of FIG. 1 according to example embodiments.
Figure 2B:
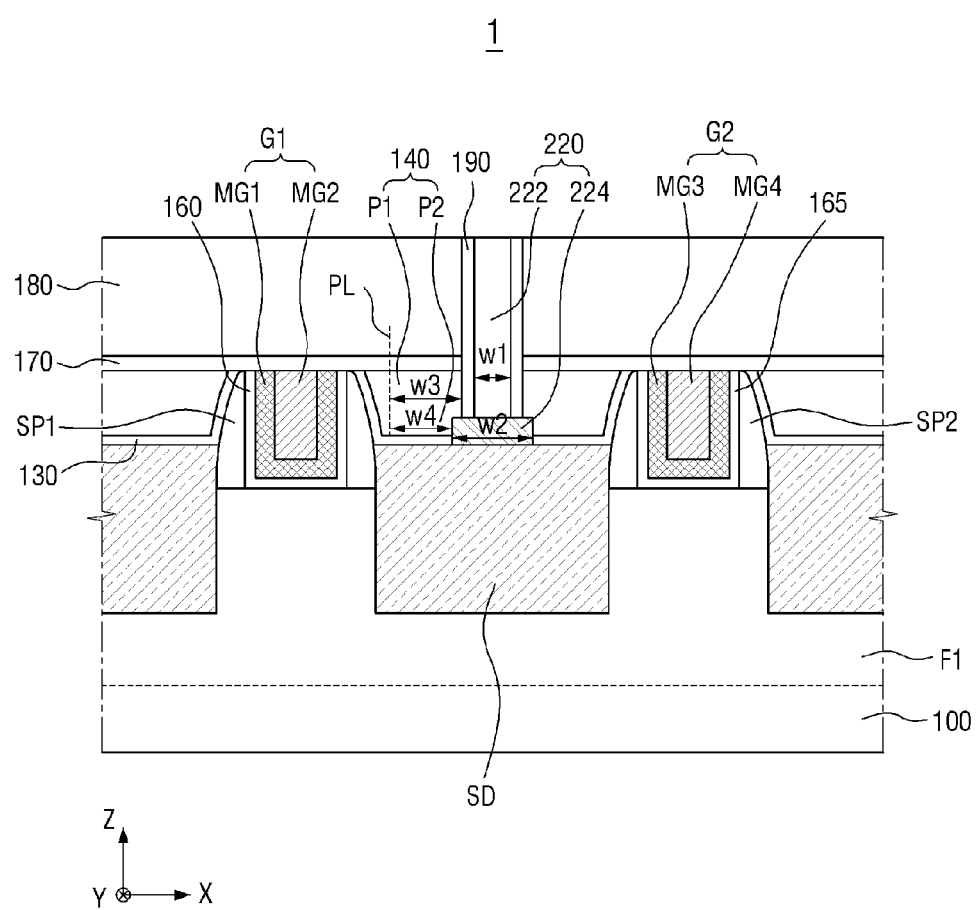
FIG. 2B is a cross-sectional view illustrating a silicide layer shown in FIG. 2A according to example embodiments.
Figure 3A:
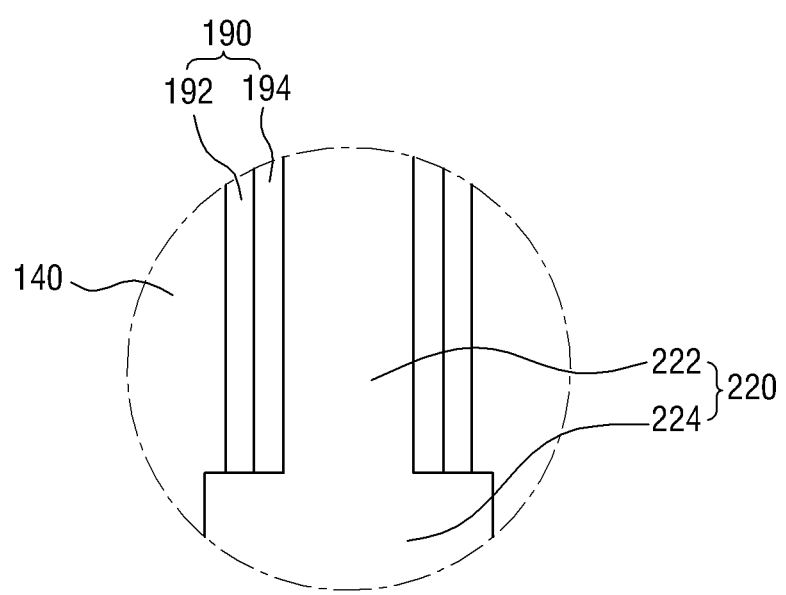
FIGS. 3A, 3B and 4 are enlarged views for explaining a portion C of FIG. 2A according to example embodiments.
Figure 3B:
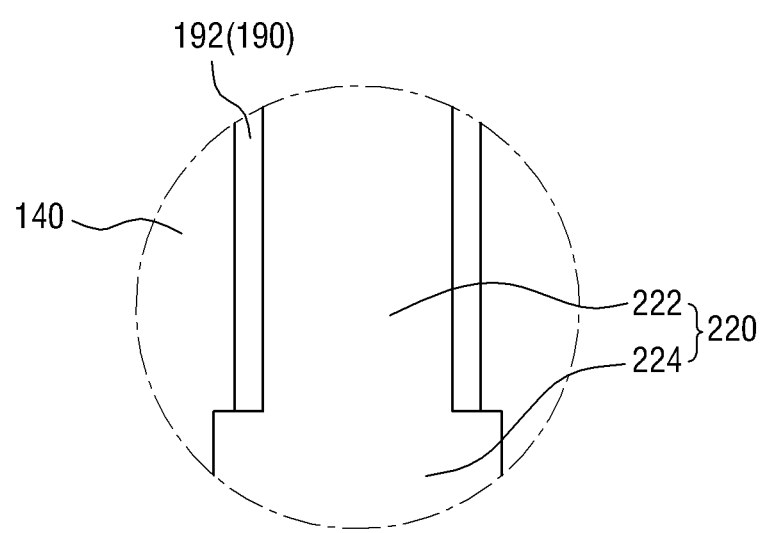
Figure 4:
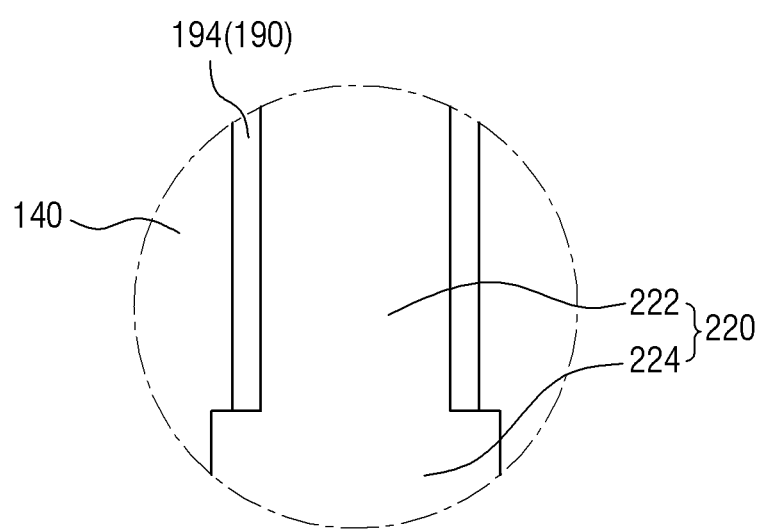
Figure 5A:
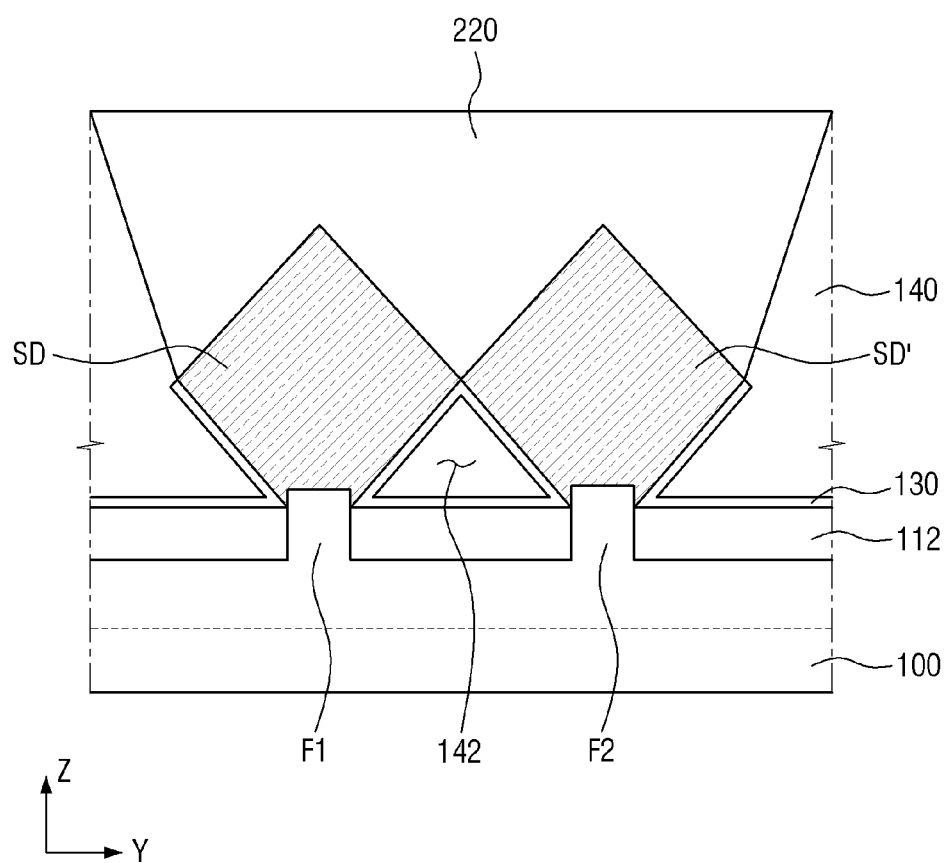
FIG. 5A is a cross-sectional view taken along the line BB' of FIG. 1 according to example embodiments.
Figure 5B:
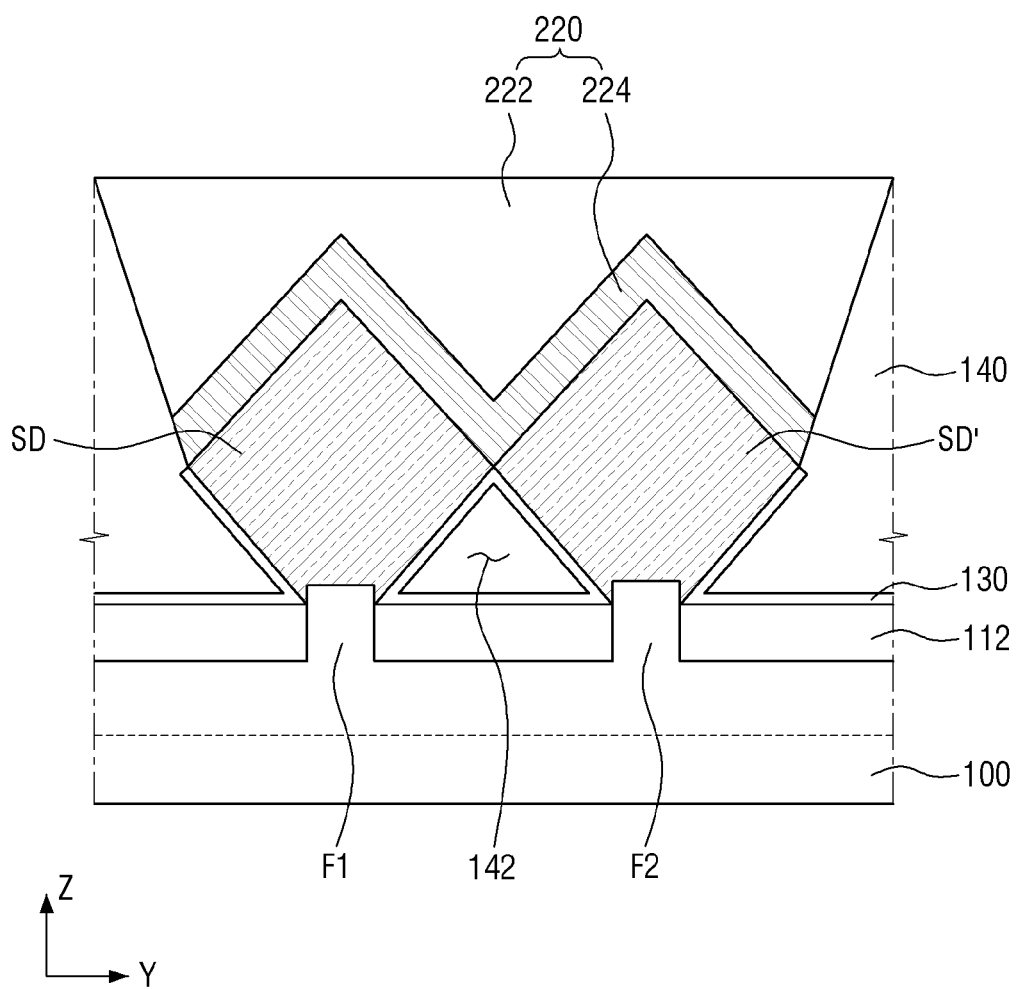
FIG. 5B is a cross-sectional view illustrating a silicide layer shown in FIG. 5A according to example embodiments.

FIG. 1 is a plan view of a semiconductor device according to example embodiments of the present inventive concept, FIG. 2A is a cross-sectional view taken along the line AA' of FIG. 1 according to example embodiments, FIG. 2B is a cross-sectional view illustrating a silicide layer shown in FIG. 2A according to example embodiments, FIGS. 3A, 3B and 4 are enlarged views for explaining a portion C of FIG. 2A according to example embodiments, FIG. 5A is a cross-sectional view taken along the line BB' of FIG. 1 according to example embodiments, and FIG. 5B is a cross-sectional view illustrating a silicide layer shown in FIG. 5A according to example embodiments. For the sake of brevity and convenient explanation, a first etch stop layer 130, a second etch stop layer 170, a first interlayer insulation layer 140, a second interlayer insulation layer 180, and a spacer layer 190 are not illustrated in FIG. 1.

As used herein, a semiconductor device may refer to any of the various devices such as shown in FIGS. 1, 2A, 2B, 6 and 7, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronics device, etc.

Referring to FIGS. 1 and 2A, the semiconductor device 1 according to example embodiments of the present inventive concept may include a substrate 100, a first active fin F1, a second active fin F2, first and second gates G1 and G2, first and second spacers SP1 and SP2, a source or drain SD (Hereinafter, referred to as a source/drain SD), first and second etch stop layers 130 and 170, first and second interlayer insulation layers 140 and 180, a spacer layer 190 (e.g., a first pair of spacer layers), and a source/drain contact 220.

The substrate 100 may be, for example, bulk silicon. Alternatively, the substrate 100 may be a silicon substrate, or a substrate made of other materials selected from the group consisting of, for example, germanium, silicon germanium, indium antimonide, lead telluride compound, indium arsenide, indium phosphide, gallium arsenide, and gallium antimonide, but aspects of the present inventive concept are not limited thereto. The substrate 100 may also be an epitaxial layer formed on a base substrate.

The first active fin F1 may be formed to protrude from the substrate 100 and may extend in a first direction X.

In example embodiments, the first active fin F1 may include, for example, one of silicon (Si) and a III-V group compound semiconductor, but aspects of the present inventive concept are not limited thereto. Examples of the III-V group compound semiconductor may include a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In example embodiments, the first active fin F1 may include the same material as the substrate 100.

The first spacers SP1 may be formed on opposite sidewalls of the first gate insulation layer 160 and the second spacers SP2 may be formed on opposite sidewalls of the second gate insulation layer 165. Each of the first spacers SP1 and the second spacers SP2 may include, for example, at least one of silicon nitride (SiN), silicon oxynitride (SiON), silicon oxide (SiO$_2$), silicon oxycarbonitride (SiOCN) and combinations thereof. Each of the first spacers SP1 and the second spacers SP2 is a single layer, but aspects of the present inventive concept are not limited thereto. Each of the first spacers SP1 and the second spacers SP2 may have a multi-layered structure.

The first and second gates G1 and G2 may be formed on the first active fin F1 and may extend in a second direction Y. The second direction Y may be perpendicular to the first direction X.

The first gate insulation layer 160 and the first gate G1 may be sequentially formed between the first spacers SP1.

The first gate G1 may include first and second metal layers MG1 and MG2. For example, as shown, the first gate G1 may be formed by stacking two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, WN, TaN, Ru, TiC, TaC, Ti, Ag, Al, TiAl, TiAlN, TiAlC, TaCN, TaSiN, Mn, Zr, W, and Al. For example, the second metal layer MG2 may include W or Al. Alternatively, the second metal layer MG2 may be a non-metal layer made of a non-metal material, such as Si, or SiGe.

The first gate insulation layer 160 may include a high-k material having a higher dielectric constant than silicon oxide. The first gate insulation layer 160 may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of the present inventive concept are not limited thereto.

As shown, the first gate insulation layer 160 and the first metal layer MG1 included in the first gate G1 may be formed to extend along sidewalls of the first spacers SP1 in a third direction Z. The third direction Z may be perpendicular to each of the first direction X and the second direction Y. The first gate insulation layer 160 and the first metal layer MG1 included in the first gate G1 are configured in such a manner because the semiconductor device 1 according to an embodiment of the present inventive concept is fabricated by a gate last process, which will later be described in more detail.

The second gate insulation layer 165 and the second gate G2 may be sequentially formed between the second spacers SP2.

The second gate G2 may include third and fourth metal layers MG3 and MG4. For example, as shown, the second gate G2 may be formed by stacking two or more metal layers MG3 and MG4. The third metal layer MG3 may function to adjust a work function, and the fourth metal layer MG4 may function to fill a space formed by the third metal layer MG3. For example, the third metal layer MG3 may include at least one of TiN, WN, TaN, Ru, TiC, TaC, Ti, Ag, Al, TiAl, TiAlN, TiAlC, TaCN, TaSiN, Mn, Zr, W, and Al. In addition, the second metal layer MG2 may include W or Al. Alternatively, the fourth metal layer MG4 may be a non-metal layer made of a non-metal material, such as Si, or SiGe.

The second gate insulation layer 165 may include a high-k material having a higher dielectric constant than silicon oxide. The second gate insulation layer 165 may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of the present inventive concept are not limited thereto.

As shown, the second gate insulation layer 165 and the third metal layer MG3 included in the second gate G2 may be formed to extend along sidewalls of the second spacers SP2 in the third direction Z.

The source/drain SD may be formed on the first active fin F1 and may be disposed at one side of the gate (e.g., the first gate G1 and the second gate G2).

The source/drain SD may be formed on the first active fin F1 and may be disposed between the first gate G1 and the second gate G2. The source/drain SD may also be formed by an epitaxial process and when necessary, impurity may be in-situ doped during the epitaxial process.

In a case where a transistor formed on the first active fin F1 is a pFET, the source/drain SD may include a compressive stress material. For example, the compressive stress material may be a material having a larger lattice constant than silicon (Si), for example, SiGe. The compressive stress material may improve the mobility of carriers of a channel region by applying compressive stress to the fin type active pattern.

Alternatively, in a case where a transistor formed on the first active fin F1 is an nFET, the source/drain SD may include the same material as the substrate 100 or a tensile stress material. For example, when the substrate 100 includes Si, the source/drain SD may include Si or a material having a smaller lattice constant than Si (e.g., SiC).

In example embodiments, the source/drain SD may have an elevated source/drain structure, and the outer circumferential surface of the source/drain SD may be at least one shape of a diamond, a circle and a rectangle, but aspects of the present inventive concept are not limited thereto.

The first etch stop layer 130 may be formed on the source/drain SD and the second etch stop layer 170 may be formed on the first and second gates G1 and G2.

In example embodiments, the first etch stop layer 130 may be formed between active fins (for example, between first and second active fins F1 and F2 of FIGS. 5A and 5B) to be formed on a field insulation layer (112 of FIGS. 5A and 5B) functioning as a device isolation layer.

The first etch stop layer 130 may prevent the source/drain SD from being damaged by an etching process performed when source/drain contact via holes (211 and 215 of FIG. 24, 212 and 215 of FIG. 25, and 214 and 215 of FIG. 26) are formed on the source/drain SD, and the second etch stop layer 170 may prevent the first and second gates G1 and G2 from being damaged by an etching process performed when gate contacts (not shown) are formed on the first and second gates G1 and G2.

In example embodiments, the first etch stop layer 130 may be formed along the outer circumferential surface of the source/drain SD (e.g., a top surface of the source/drain SD) and may prevent a profile of the source/drain SD from being damaged by the etching process performed when the source/drain contact via holes (211 and 215 of FIG. 24, 212 and 215 of FIG. 25, and 214 and 215 of FIG. 26) are formed. The first etch stop layer 130 allows the semiconductor device 1 according to an embodiment of the present inventive concept to have the source/drain SD having a secured profile even after the source/drain contact 220 is formed. In example embodiments, the source/drain contact 220 may include a first contact region 222 and a second contact region 224 positioned between the source/drain SD and the first contact region 222.

The first etch stop layer 130 and the second etch stop layer 170 may include, for example, SiN, but aspects of the present inventive concept are not limited thereto.

The first interlayer insulation layer 140 may be formed to cover the first and second gates G1 and G2 and the source/drain SD and the second interlayer insulation layer 180 may be formed to cover the second etch stop layer 170.

For example, the first interlayer insulation layer 140 may be formed to cover the first etch stop layer 130. In addition, the first interlayer insulation layer 140 may include a first part P1 and a second part P2 formed between the source/drain SD and the first part P1.

A first surface of the first part P1 may contact the spacer layer 190 and a first surface of the second part P2 may contact the second contact region 224. For example, on the basis of a particular line PL perpendicular to a bottom surface of the first interlayer insulation layer 140, a third width W3 of the first part P1 in the first direction X from the particular line PL to the first surface of the first part P1 and a fourth width W4 of the second part P2 in the first direction X from the particular line PL to the first surface of the second part P2 may be different from each other at a boundary surface between the first part P1 and the second part P2. For example, the third width W3 may be greater than the fourth width W4.

The first part P1 may be positioned at one side of the first contact region 222 of the source/drain contact 220, and the second part P2 may be positioned at one side of the second contact region 224 of the source/drain contact 220. A top of the second part P2 may be positioned on the same plane with a top surface of the second contact region 224.

The second part P2 may be adjacent to a top portion of the source/drain SD and may be positioned between the gate (e.g., the first gate G1) and the source/drain contact 220. For example, the second part P2 may be a part surrounded by the first etch stop layer 130, the first part P1 and the source/drain contact 220. The interface between the first part P1 and the second part P2 may have a step-shape, as can be seen in FIGS. 2A and 2B.

Each of the first and second interlayer insulation layers 140 and 180 may include, for example, at least one of a low-k material layer, an oxide layer, a nitride layer and an oxynitride layer. The low-k material may include, for example, flowable oxide (FOX), tonen silazene (TOSZ), undoped silica glass (USG), borosilica glass (BSG), phosphosilaca glass (PSG), borophosphosilica glass (BPSG), plasma enhanced tetra ethyl ortho silicate (PE-TEOS), fluoride silicate glass (FSG), high density plasma (HDP), plasma enhanced oxide (PEOX), flowable CVD (FCVD), and combinations thereof, but aspects of the present inventive concept are not limited thereto.

When the spacer layer 190 has an ONO (i.e., oxide-nitride-oxide) structure, for example, the first interlayer insulation layer 140 may include a different low-k material layer from the oxide layer of the spacer layer 190, but aspects of the present inventive concept are not limited thereto. For example, even when the spacer layer 190 has an ONO (i.e., oxide-nitride-oxide) structure, the first interlayer insulation layer 140 may include the same low-k material layer with the oxide layer of the spacer layer 190.

In example embodiments, the spacer layer 190 may be formed between the source/drain contact 220 and the interlayer insulation layer (i.e., the first and second interlayer insulation layers 140 and 180).

For example, the spacer layer 190 may be formed to extend along sidewalls of the source/drain contact 220 or the interlayer insulation layer (i.e., the first and second interlayer insulation layers 140 and 180).

The spacer layer 190 will later be described in more detail.

The source/drain contact 220 may pass through the interlayer insulation layer (for example, the first and second interlayer insulation layers 140 and 180) to then be connected to the source/drain SD. In addition, the source/drain contact 220 may include, for example, W or Ti, but aspects of the present inventive concept are not limited thereto.

For example, a width of the first contact region 222 in the first direction X is a first width W1 and a width of the second contact region 224 in the first direction X is a second width W2, the first width W1 and the second width W2 may be different from each other at a boundary line between the first contact region 222 and the second contact region 224. For example, the first width W1 may be smaller than the second width W2.

In example embodiments, the spacer layer 190 includes a first spacer and a second spacer. The first spacer of the spacer layer 190 is disposed adjacent to a first side of the first contact region 222 and a second spacer of the spacer layer 190 is disposed adjacent to a second side opposite to the first side of the first contact region 222. The first spacer of the spacer layer 190 has a fifth width W5 in the first direction and the second spacer of the spacer layer 190 has a sixth width W6 in the first direction. The fifth width W5 may substantially equal to the sixth width W6.

In example embodiments, a bottom surface of the second contact region 224 may fully vertically overlap a bottom surface of each of the first and second spacers of the spacer layer 190.

In example embodiments, the second width W2 of the second contact region 224 in the first direction X is greater than the sum of a first width W1 of the first contact region 222 in the first direction X and the fifth and sixth widths W5 and W6 of the spacer layer 190 in the first direction X.

Referring to FIG. 2B, the same technical features as described with reference to FIG. 2A will be omitted for the purpose of ease and convenience in explanation. Hereinafter, the same elements as mentioned in FIG. 2A will be indicated by the same reference numerals.

In example embodiments, the second contact region 224 in FIG. 2B may include a silicide layer. For example, the silicide layer 224 may be formed on the source/drain SD to have the second width W2 greater than the first width W1. The silicide layer completely filling the second contact region 224 is illustrated in FIG. 2B, but aspects of the present inventive concept are not limited thereto. For example, the silicide layer may partially fill the second contact region 224.

Referring to FIG. 3A, the spacer layer 190 may include a first sub spacer layer 192 and a second sub spacer layer 194 extending along sidewalls of the first contact region 222. For example, the spacer layer 190 may have its original ONO (i.e., oxide-nitride-oxide) structure, and the spacer layer 190 shown in FIG. 3A may have a structure resulting from an etching process, including the first sub spacer layer 192 and the second sub spacer layer 194.

The first sub spacer layer 192 may be formed between the interlayer insulation layer (i.e., the first and second interlayer insulation layers 140 and 180) and the second sub spacer layer 194. In addition, the first sub spacer layer 192 may include, for example, an oxide layer, specifically $SiO_2$, but aspects of the present inventive concept are not limited thereto.

The first and second interlayer insulation layers 140 and 180 may include a different low-k material from the first sub spacer layer 192, but aspects of the present inventive concept are not limited thereto.

The second sub spacer layer 194 may be formed between the first sub spacer layer 192 and the first contact region 222. In addition, the second sub spacer layer 194 may include, for example, a nitride layer, specifically SiN, but aspects of the present inventive concept are not limited thereto.

In example embodiments, a top of the second contact region 224 may be positioned on the same plane with a bottom surface of the spacer layer 190.

The spacer layer 190 including only the first sub spacer layer 192 is illustrated in FIG. 3B, but aspects of the present inventive concept are not limited thereto.

Referring to FIG. 3B, only the first sub spacer layer 192 of the spacer layer 190 may remain after the etching process, which will later be described in detail.

Referring to FIG. 4, the spacer layer 190 may include only the second sub spacer layer 194 extending along sidewalls of the first contact region 222. For example, the spacer layer 190 may have its original ON (i.e., oxide-nitride) structure, and the spacer layer 190 shown in FIG. 4 may have a structure including only the second sub spacer layer 194.

The second sub spacer layer 194 may be formed between the interlayer insulation layer (i.e., the first and second interlayer insulation layers 140 and 180) and the first contact region 222. In addition, the second sub spacer layer 194 may include, for example, a nitride layer, specifically SiN, but aspects of the present inventive concept are not limited thereto.

As described above, the first and second interlayer insulation layers 140 and 180 may include at least one of a low-k material layer, for example, an oxide layer, a nitride layer and an oxynitride layer.

A top surface of the second contact region 224 may be positioned on the same plane with a bottom surface of the spacer layer 190.

Referring to FIG. 5A, the source/drain contact 220 is formed on a first source/drain SD and the second source/drain SD' and the first etch stop layer 130 is formed to surround bottom surfaces of the first source/drain SD and the second source/drain SD'. The first interlayer insulation layer 140 may not be formed in a portion surrounded by the first etch stop layer 130 and the portion surrounded by the first etch stop layer 130 may correspond to a void 142. As shown in FIG. 5, the first etch stop layer 130 is conformally formed in the void 142 along the first source/drain SD and the second source/drain SD' and the field insulation layer 112, but aspects of the present inventive concept are not limited thereto. For example, the first etch stop layer 130 may not partially formed in the void 142 according to the forming method of the first etch stop layer 130.

Top surface profiles of the first source/drain SD and the second source/drain SD' shown in FIG. 5A are not damaged, but some of the top surface profiles of the first source/drain SD and the second source/drain SD' may be damaged within an error tolerance of the fabrication process.

The source/drain contact 220 coinciding with a boundary surface between each of the first source/drain SD and the second source/drain SD' and the first etch stop layer 130 is illustrated in FIG. 5A, but aspects of the present inventive concept are not limited thereto.

Referring to FIG. 5B, the second contact region (e.g., the silicide layer 224) is formed along top surfaces of the first source/drain SD and the second source/drain SD'.

For the sake of brevity and convenient explanation, the silicide layer will not be separately illustrated in the following description.

In the semiconductor device 1 according to example embodiments of the present inventive concept, a short between the gate (that is, the first gate G1 or the second gate G2) and the source/drain contact 220 may be prevented by performing an etching process to be described later using the spacer layer 190. In addition, a profile of the source/drain SD may be secured through high selectivity etching using an ion implantation process to be described later.

Hereinafter, a semiconductor device 2 according to example embodiments of the present inventive concept will be described with reference to FIG. 6.

Figure 6:
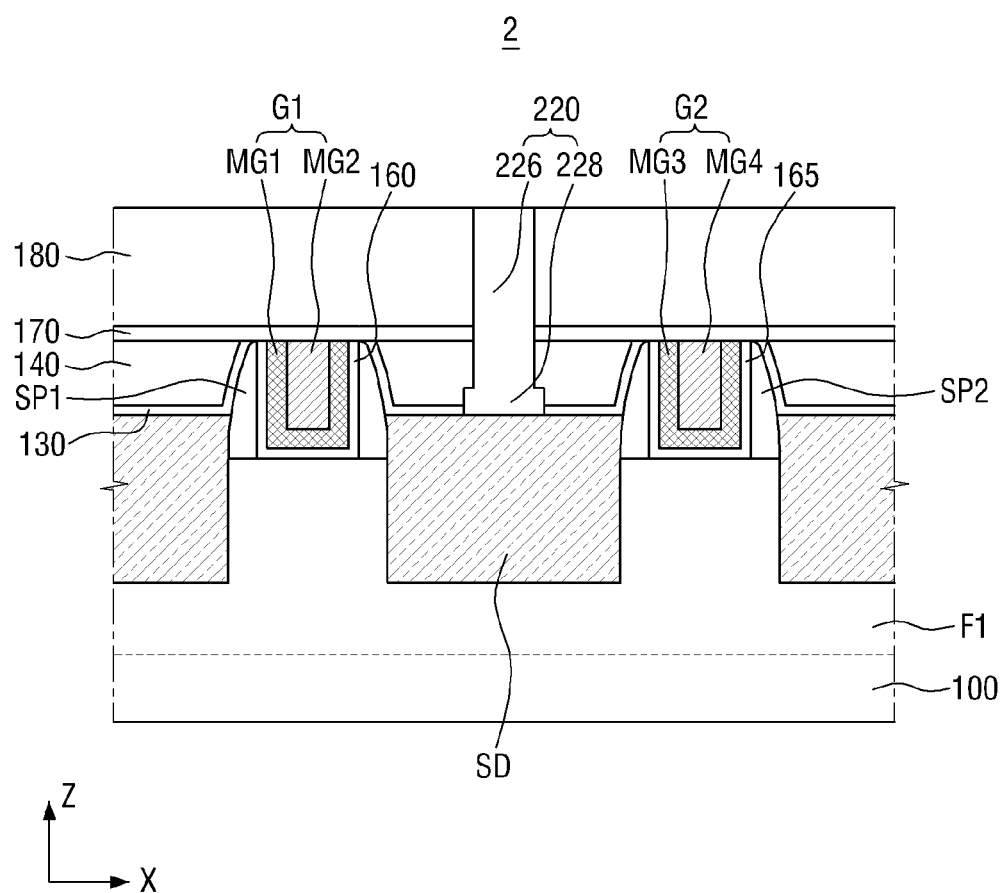
FIG. 6 is a cross-sectional view of a semiconductor device according to example embodiments of the present inventive concept.

FIG. 6 is a cross-sectional view of a semiconductor device according to example embodiments of the present inventive concept.

The following description will focus on differences between the present and previous embodiments of the present inventive concept.

Referring to FIG. 6, the semiconductor device 2 does not include a spacer layer, unlike the semiconductor device 1. This is because the spacer layer is completely removed in an etching process for forming source/drain contact via holes (214 and 215 of FIG. 26).

As the spacer layer is completely removed, a width of a first contact region 226 in a first direction X in the semiconductor device 2 may be greater than the first width W1 of the first contact region 222 shown in FIG. 2A.

The semiconductor device 2 shown in FIG. 6 still may have the same effect with the semiconductor device 1 according to the previous embodiment, except that the spacer layer is completely removed.

Hereinafter, a semiconductor device 3 according to example embodiments of the present inventive concept will be described with reference to FIG. 7.

Figure 7:
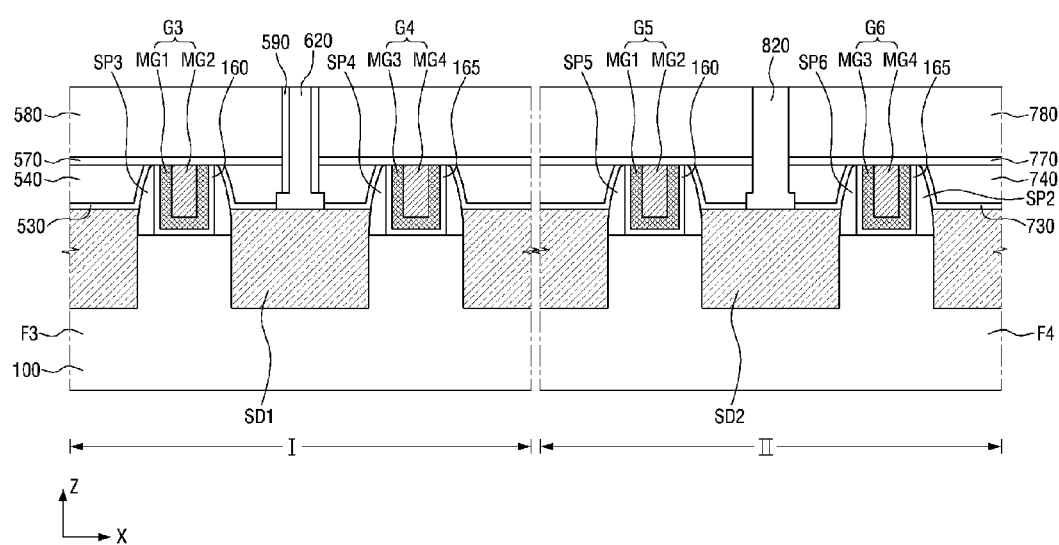
FIG. 7 is a cross-sectional view of a semiconductor device according to example embodiments of the present inventive concept.

FIG. 7 is a cross-sectional view of a semiconductor device according to example embodiments of the present inventive concept.

The following description will focus on differences between the present and previous embodiments of the present inventive concept.

Referring to FIG. 7, in the semiconductor device 3 according to example embodiments of the present inventive concept, a substrate 100 may include a first region I and a second region II.

The semiconductor device 3 may include a CMOS transistor. For example, the first region I of the substrate 100 may include one of a PMOS transistor and an NMOS transistor, and the second region II of the substrate 100 may include the other of the PMOS transistor and the NMOS transistor.

The first region I of the substrate 100 may include a semiconductor device with a spacer layer 590 (e.g., the semiconductor device 1 of FIG. 2A) and the second region II of the substrate 100 may include a semiconductor device without a spacer layer (e.g., the semiconductor device 2 of FIG. 6).

Hereinafter, a method for fabricating the semiconductor device shown in FIG. 2A will be described with reference to FIGS. 8 to 25.

FIGS. 8 to 25 illustrate intermediate process steps in a method for fabricating the semiconductor device shown in FIG. 2A according to example embodiments.

Figure 8:
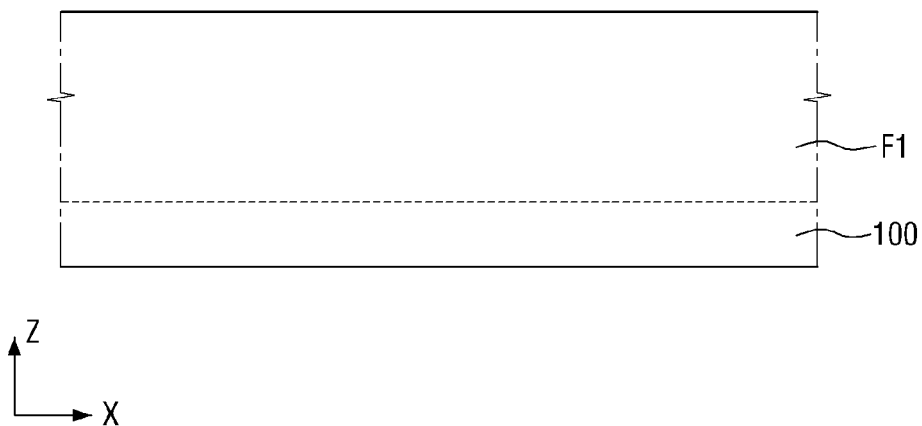
FIGS. 8 to 25 illustrate intermediate process steps in a method for fabricating the semiconductor device shown in FIG. 2 according to example embodiments.

Referring to FIG. 8, a first active fin F1 extending in a first direction X may be formed on a substrate 100.

The first active fin F1 may extend in the first direction X and may be formed to protrude from the substrate 100 in a third direction Z.

Figure 9:
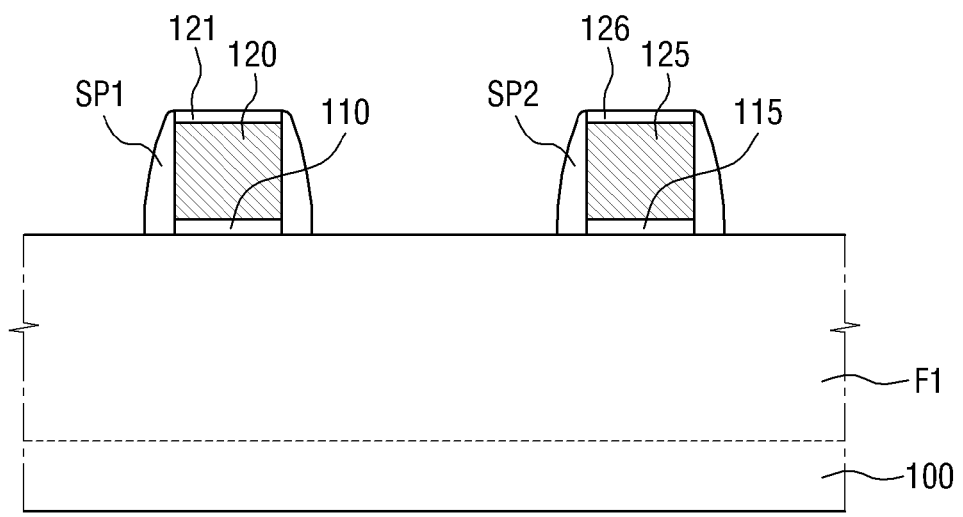

Referring to FIG. 9, an etching process may be performed using first and second gate mask patterns 121 and 126, thereby forming first and second dummy gate insulation layers 110 and 115 and first and second dummy gates 120 and 125 extending in a second direction Y crossing the first active fin F1.

For example, the first and second dummy gate insulation layers 110 and 115 may include silicon oxide and the first and second dummy gates 120 and 125 may include polysilicon, but aspects of the present inventive concept are not limited thereto.

First spacers SP1 are formed on opposite sidewalls of the first dummy gate 120 and second spacers SP2 are formed on opposite sidewalls of the second dummy gate 125.

For example, after an insulation layer is formed on the resultant product having the first dummy gate 120 and the second dummy gate 125, and an etch-back process is performed, thereby forming the first spacers SP1 and the second spacers SP2. The first spacers SP1 and the second spacers SP2 may expose top surfaces of the first and second gate mask patterns 121 and 126 and a top surface of the first active fin F1.

Figure 10:
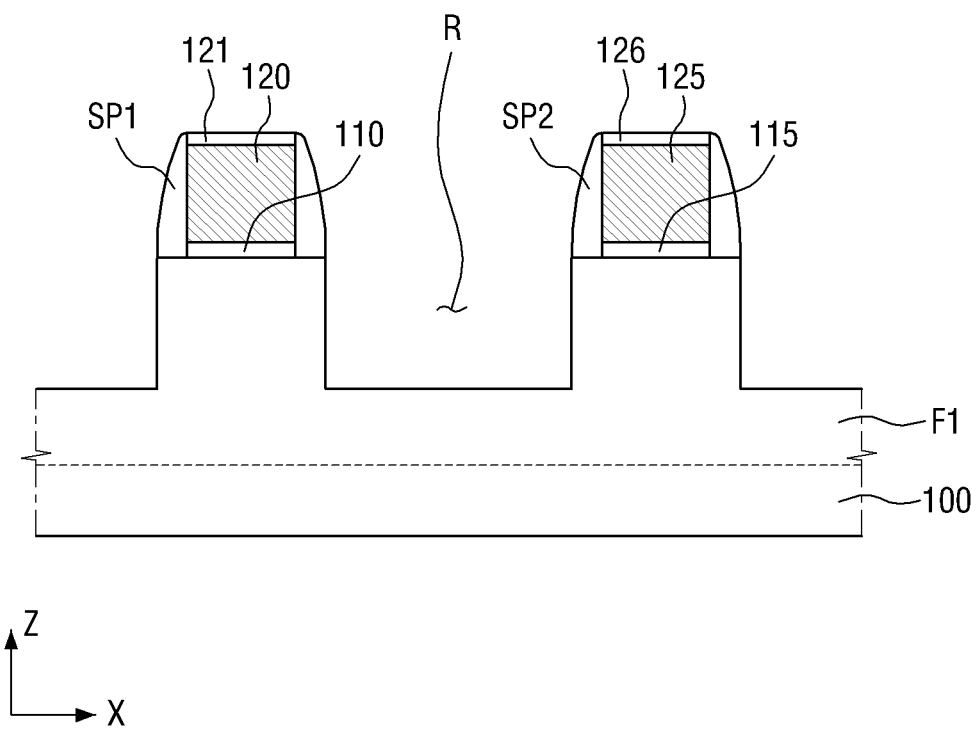

Referring to FIG. 10, a recess R may be formed in the first active fin F1.

The recess R may be formed in the first active fin F1 between the dummy gates (for example, between the first dummy gate 120 and the second dummy gate 125). Also, the recess R may be formed in the left side of the first dummy gate 120 and the right side of the second dummy gate 125. The recess R may be formed by etching the first active fin F1 using the first spacers SP1 and the second spacers SP2 as etch masks.

Figure 11:
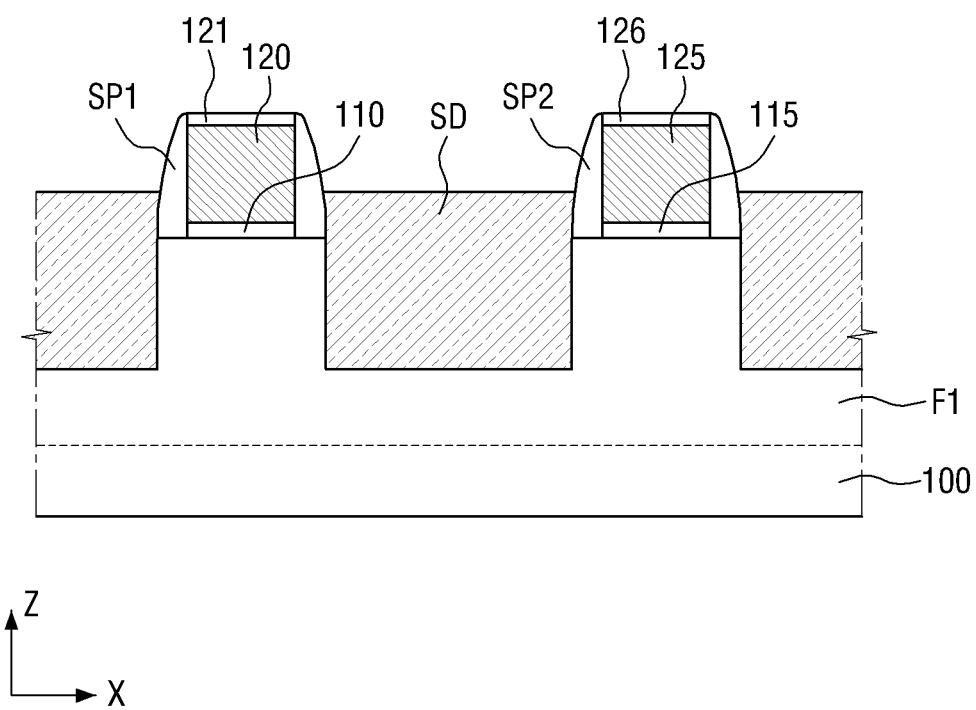

Referring to FIG. 11, a source/drain SD may be formed in the recess (R of FIG. 10). For example, the source/drain SD may be an elevated source/drain. For example, a top surface of the source/drain SD may be positioned higher than a top surface of the first active fin F1.

When a transistor formed on the first active fin F1 is a PMOS transistor, the source/drain SD may include a compressive stress material. For example, the compressive stress material may be a material having a larger lattice constant than silicon (Si), for example, SiGe.

When a transistor formed on the first active fin F1 is an NMOS transistor, the source/drain SD may include the same material as the substrate 100 or a tensile stress material. For example, when the substrate 100 includes Si, the source/drain SD may include Si or a material having a smaller lattice constant than Si for example, SiC.

The source/drain SD may be formed by an epitaxial process. Additionally, according to whether the transistor formed on the first active fin F1 is a PMOS transistor or an NMOS transistor, materials of the source/drain SD may vary. For example, impurity may be in-situ doped during the epitaxial process.

Figure 12:
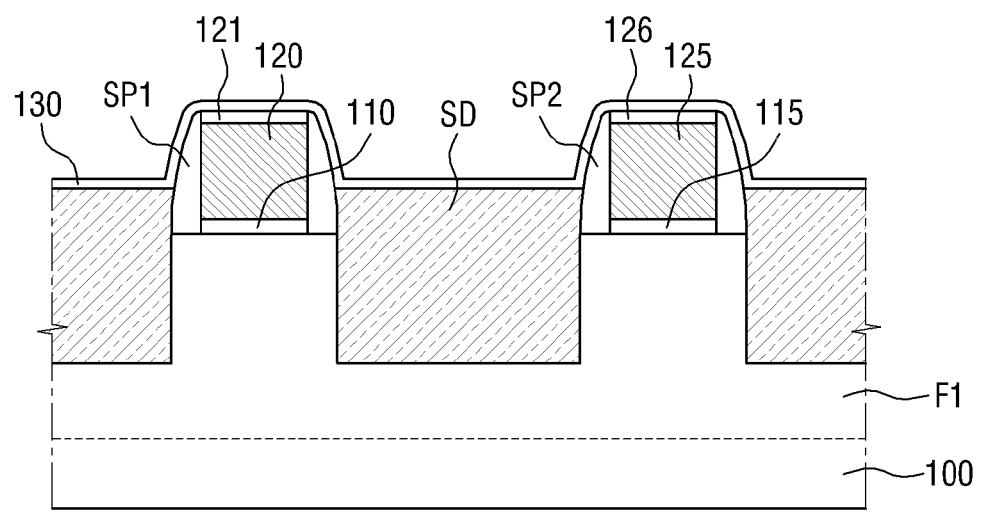

Referring to FIG. 12, a first etch stop layer 130 may be formed on the source/drain SD.

The first etch stop layer 130 may be formed to cover the source/drain SD, the first and second gate mask patterns 121 and 126 and the first and second spacers SP1 and SP2.

The first etch stop layer 130 may prevent a profile of the source/drain SD from being damaged by an etching process performed when source/drain contact via holes (211 and 215 of FIG. 24, 212 and 215 of FIG. 25, and 214 and 215 of FIG. 26) are formed, which will later be described.

The forming of the first etch stop layer 130 may be performed by, for example, chemical vapor deposition (CVP) or atomic layer deposition (ALD), but aspects of the present inventive concept are not limited thereto.

A thickness of the first etch stop layer 130 may be, for example, 20 Å, but aspects of the present inventive concept are not limited thereto.

Figure 13:
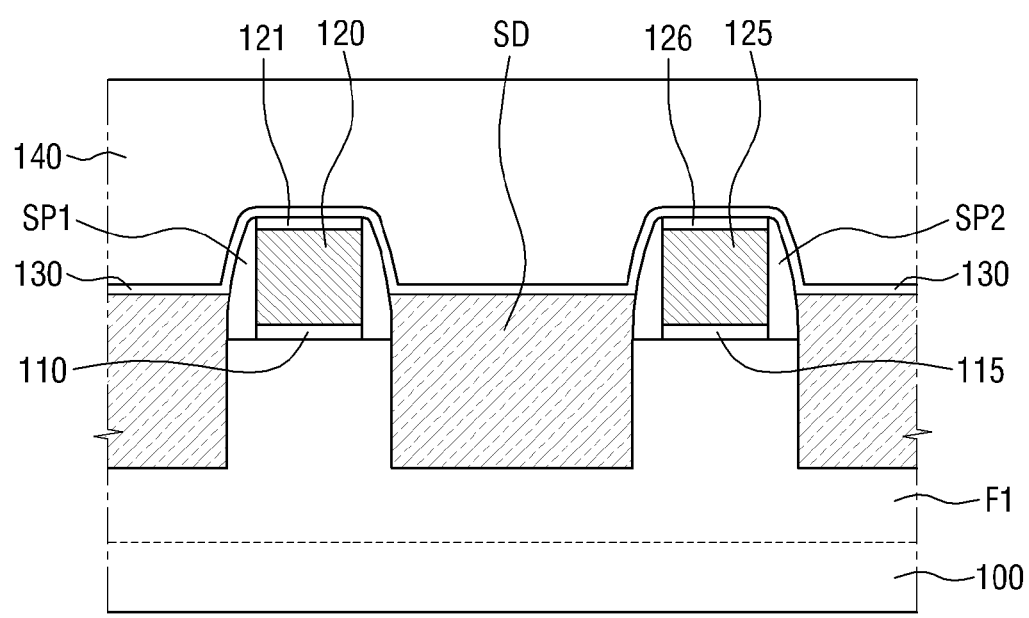
Figure 14:
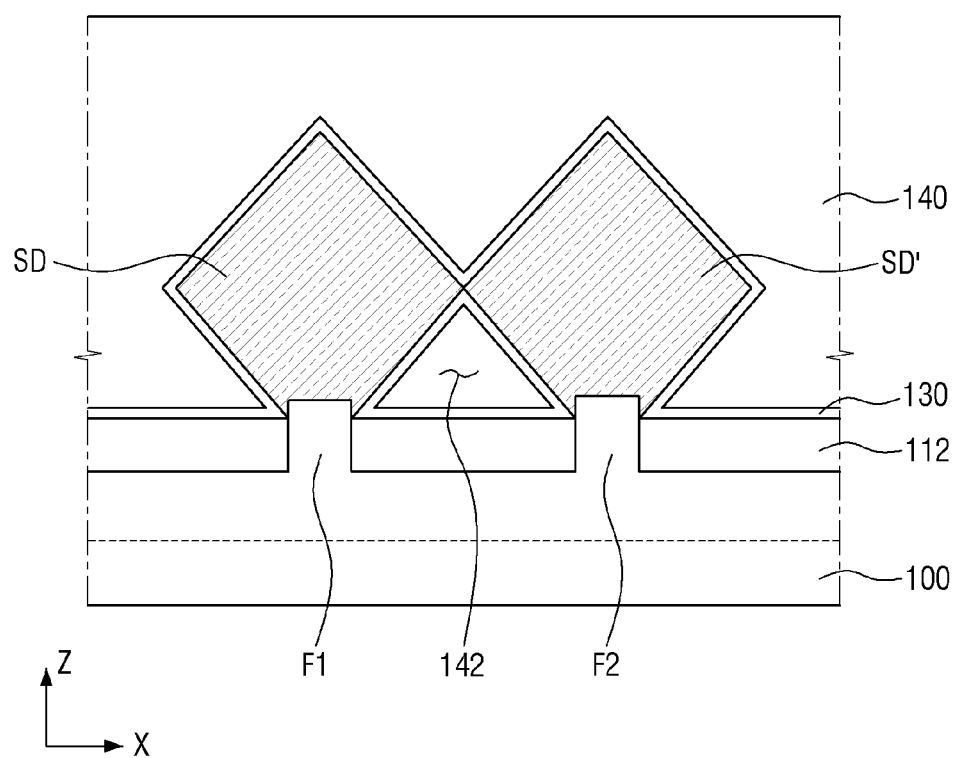

Referring to FIGS. 13 and 14, a first interlayer insulation layer 140 may be formed on the first etch stop layer 130.

The first interlayer insulation layer 140 may be formed on the first etch stop layer 130 surrounding the first source/drain SD and the second source/drain SD'. For example, the first interlayer insulation layer 140 may not be formed in a void 142 surrounded by the first etch stop layer 130. For example, a portion of the first interlayer insulation layer 140 may be formed in the void 142 within an error tolerance of the fabrication process.

Figure 15:
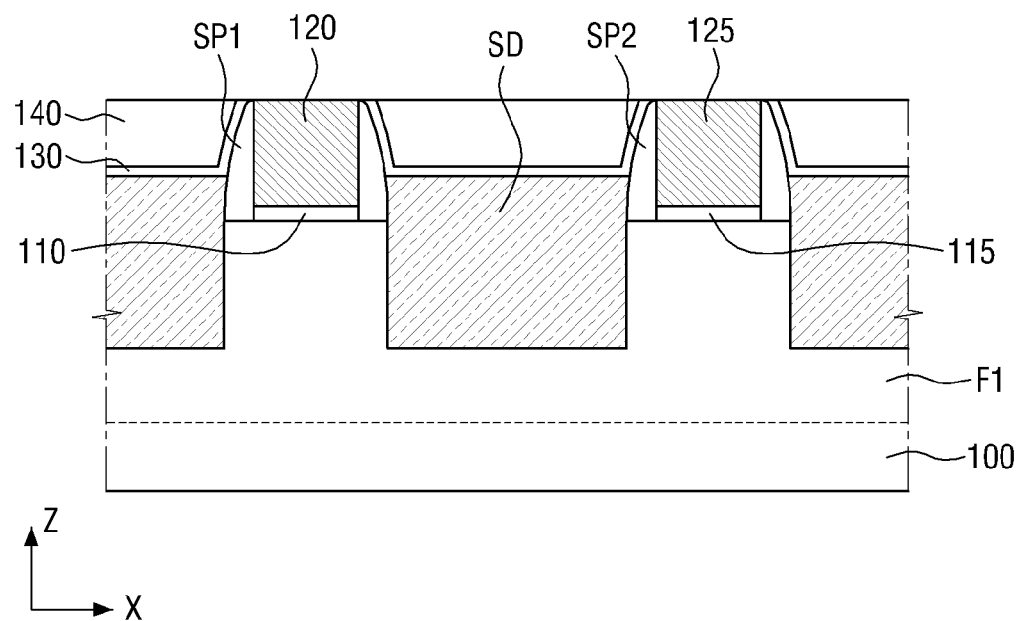

Referring to FIG. 15, the first interlayer insulation layer 140 may be planarized until the top surfaces of the first and second dummy gates 120 and 125 are exposed.

The planarizing of the first interlayer insulation layer 140 may be performed by, for example, chemical mechanical planarization (CMP), but aspects of the present inventive concept are not limited thereto.

Figure 16:
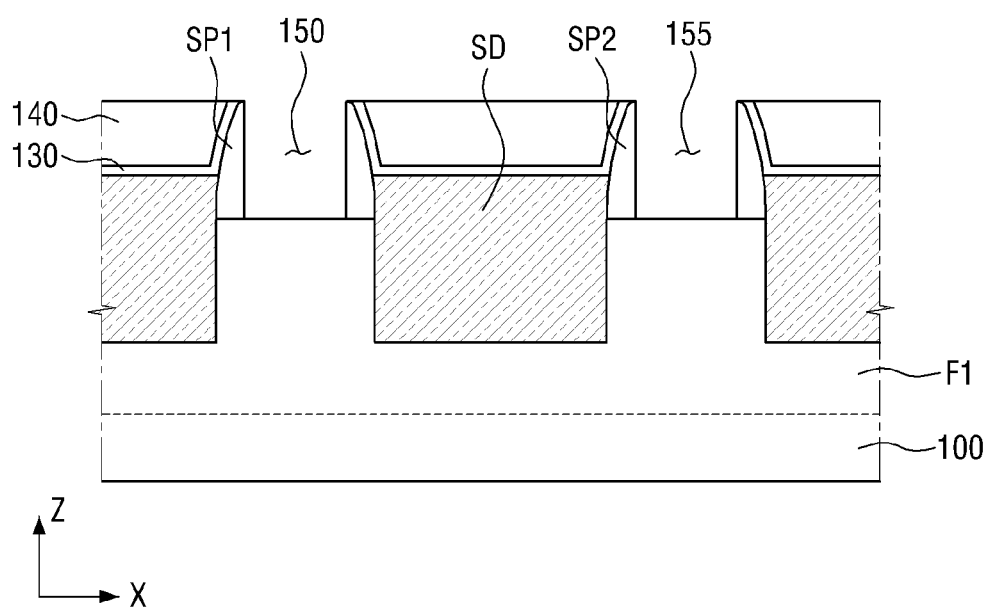

Referring to FIG. 16, the first and second dummy gates 120 and 125 and the first and second dummy gate insulation layers 110 and 115 may be removed.

As the first and second dummy gates 120 and 125 and the first and second dummy gate insulation layers 110 and 115 are removed, first and second trenches 150 and 155 exposing the top surface of the first active fin F1 may be formed.

Figure 17:
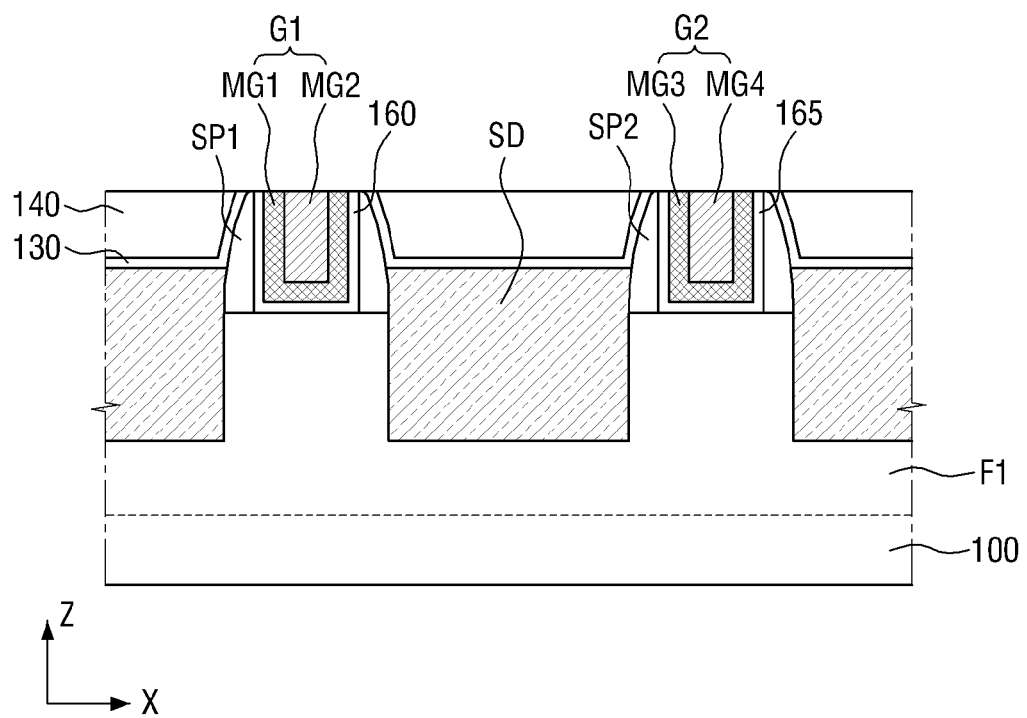

Referring to FIG. 17, a first gate insulation layer 160 and a first gate G1 may be formed in the first trench (150 of FIG. 16) and a second gate insulation layer 165 and a second gate G2 are formed in the second trench (155 of FIG. 16).

The first and second gate insulation layers 160 and 165 may include a high-k material having a higher dielectric constant than silicon oxide. For example, the first and second gate insulation layers 160 and 165 may include $HfO_2$, $ZrO_2$ or $Ta_2O_5$.

The first gate insulation layer 160 may be substantially conformally formed along sidewalls and a bottom surface of the first trench (150 of FIG. 16) and the second gate insulation layer 165 may be substantially conformally formed along sidewalls and a bottom surface of the second trench (155 of FIG. 16).

The first gate G1 may include first and second metal layers MG1 and MG2. As shown, the first gate insulation layer 160 and the first metal MG1 included in the first gate G1 may be formed to extend in the third direction Z along sidewalls of the first spacers SP1. The first metal layer MG1 may function to adjust a work function, and the second metal layer MG2 may function to fill a space formed by the first metal layer MG1.

The second gate G2 may include third and fourth metal layers MG3 and MG4. As shown, the second gate insulation layer 165 and the third metal layer MG3 included in the second gate G2 may be formed to extend in the third direction Z along sidewalls of the second spacers SP2. The third metal layer MG3 may function to adjust a work function, and the fourth metal layer MG4 may function to fill a space formed by the third metal layer MG3.

The first spacers SP1, the first gate G1 and the first gate insulation layer 160 may be referred to as a first gate structure. Also, the second spacers SP2, the second gate G2 and the second gate insulation layer 165 may be referred to as a second gate structure.

Figure 18:
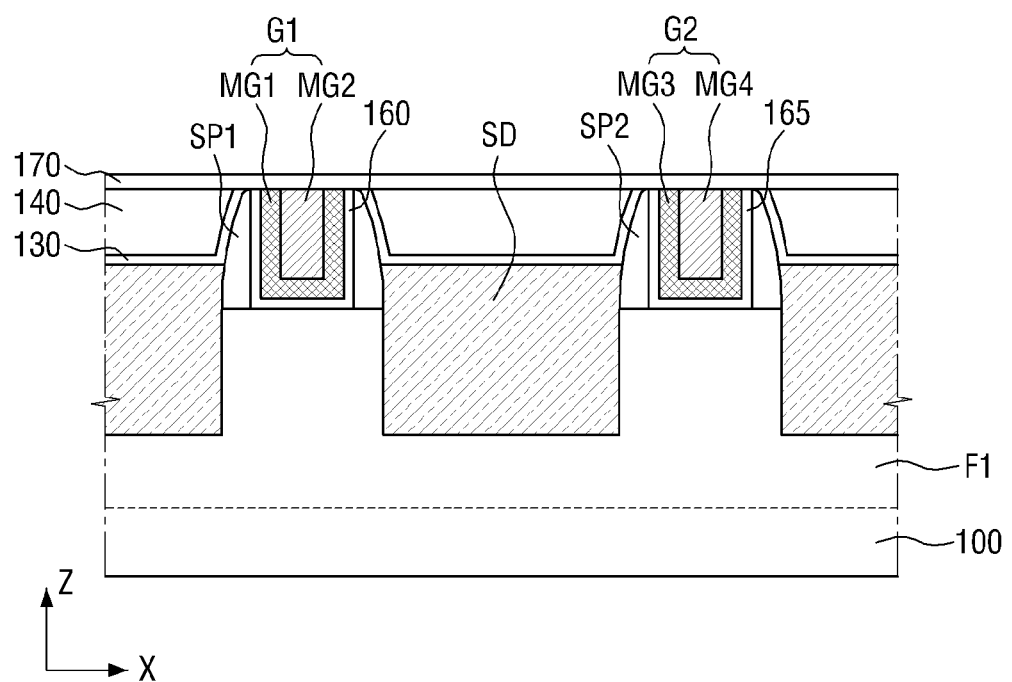

Referring to FIG. 18, a second etch stop layer 170 may be formed on the first interlayer insulation layer 140.

For example, the second etch stop layer 170 may be formed to cover the first interlayer insulation layer 140 and the first and second gate structures (e.g., the first and second gates G1 and G2, the first and second spacers SP1 and SP2 and the first and second gate insulation layers 160 and 165).

Although not shown, the second etch stop layer 170 may prevent profiles of the first and second gates G1 and G2 from being damaged by an etching process performed when gate contact via holes are formed.

The forming of the second etch stop layer 170 may be performed by, for example, chemical vapor deposition (CVP) or atomic layer deposition (ALD), but aspects of the present inventive concept are not limited thereto.

Figure 19:
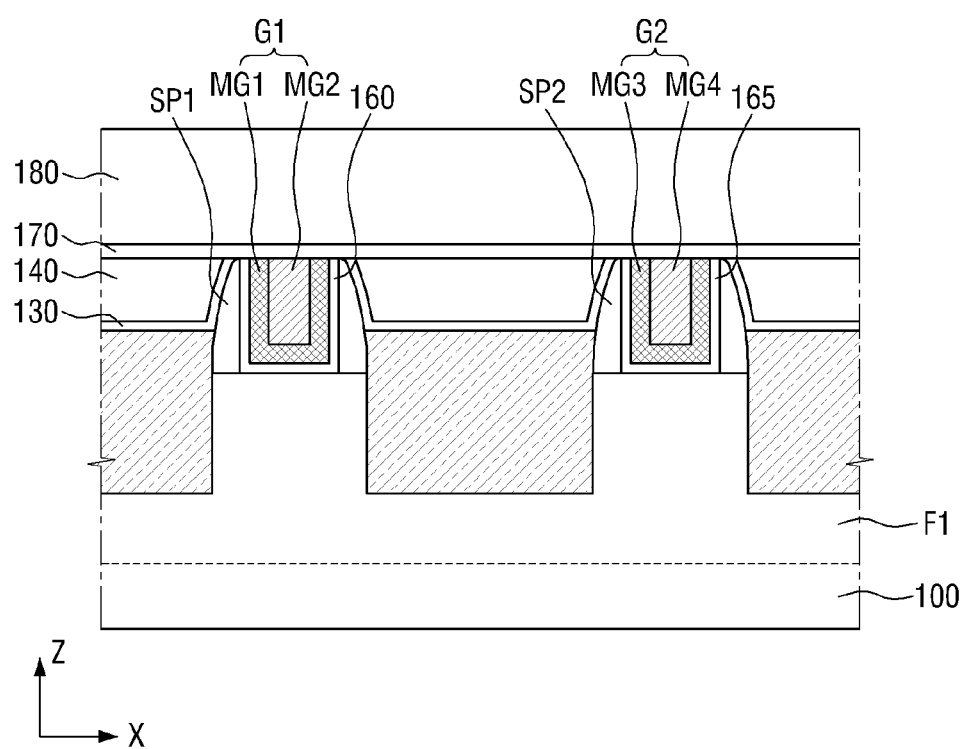

Referring to FIG. 19, a second interlayer insulation layer 180 may be formed on the second etch stop layer 170.

The second interlayer insulation layer 180 may include at least one of a low-k material layer, for example, an oxide layer, a nitride layer or an oxynitride layer.

Figure 20:
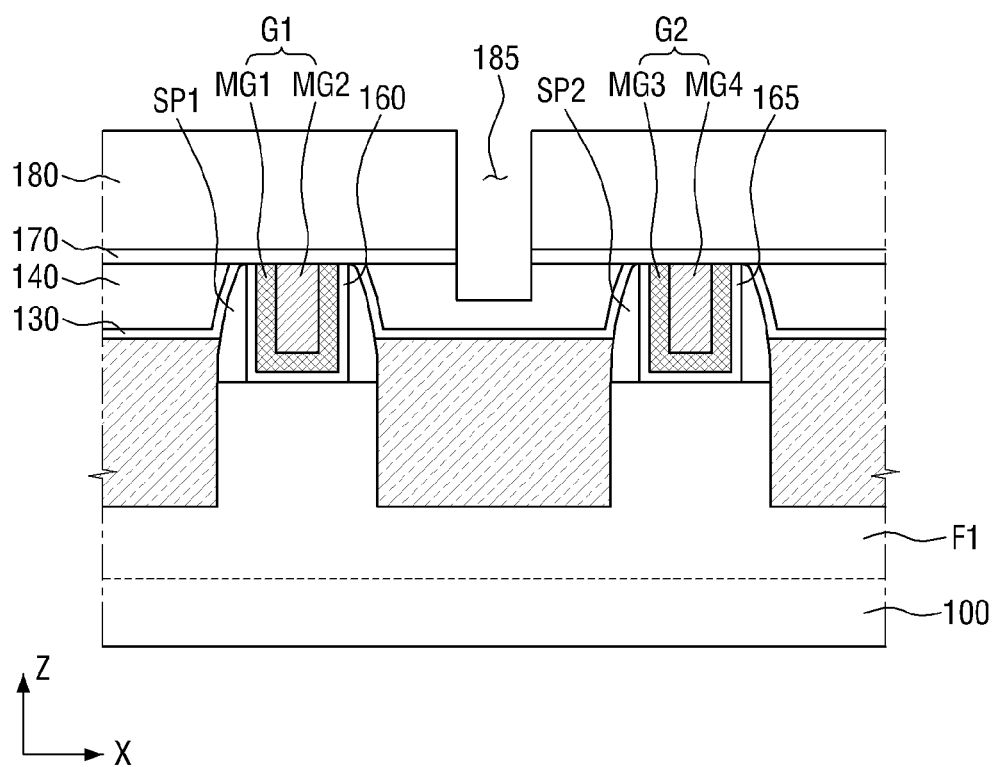

Referring to FIG. 20, a source/drain contact via hole 185 vertically (e.g., in the third direction Z) spaced apart from the source/drain SD may be formed by etching the second interlayer insulation layer 180.

As shown FIG. 20, the source/drain contact via hole 185, extending to pass through the first interlayer insulation layer 140, the second etch stop layer 170 and the second interlayer insulation layer 180, may be formed by an etching process. The etching process may be performed only to a predetermined depth of the first interlayer insulation layer 140 so as not to expose the first etch stop layer 130.

The source/drain contact via hole 185 straightly extending in the third direction Z is illustrated in FIG. 20, but aspects of the present inventive concept are not limited thereto. For example, opposite sidewalls of the source/drain contact via hole 185 may be tilted at a predetermined angle with respect to a bottom surface of the source/drain contact via hole 185. For the sake of brevity and convenient explanation, the following description will be given with regard to the source/drain contact via hole 185 shown in FIG. 20 by way of example.

Figure 21:
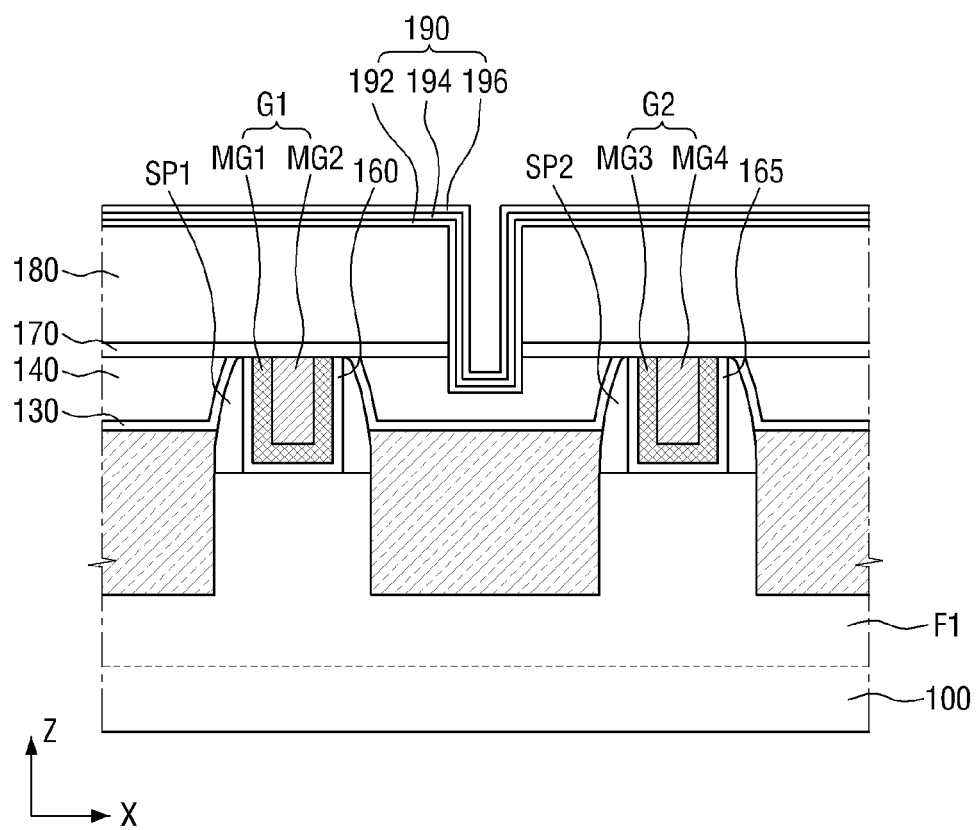

Referring to FIG. 21, a spacer layer 190 may be formed along the source/drain contact via hole 185.

The spacer layer 190 may be formed along a top surface of the second interlayer insulation layer 180 and sidewalls and a bottom surface of the source/drain contact via hole 185.

In example embodiments, the spacer layer 190 may include first to third sub spacer layers 192, 194 and 196. The first to third sub spacer layers 192, 194 and 196 may be sequentially stacked. The spacer layer 190 having an ONO (i.e., oxide-nitride-oxide) structure is illustrated in FIG. 21, but aspects of the present inventive concept are not limited thereto. For example, the spacer layer 190 may have an ON (i.e., oxide-nitride) structure.

The first sub spacer layer 192 may be formed on the innermost part of the spacer layer 190 and may be formed between the interlayer insulation layer (i.e., the first interlayer insulation layer 140 and the second interlayer insulation layer 180) and the second sub spacer layer 194. The first sub spacer layer 192 may include, for example, an oxide layer, specifically $SiO_2$, but aspects of the present inventive concept are not limited thereto.

The first sub spacer layer 192 may prevent the second sub spacer layer 194 from being oxidized. A thickness of the first sub spacer layer 192 may be smaller than a thickness of the second sub spacer layer 194. For example, the thickness of the first sub spacer layer 192 may be 10 Å, but aspects of the present inventive concept are not limited thereto.

When the spacer layer 190 has an ONO structure, as described above, the first and second interlayer insulation layers 140 and 180 may include a different low-k material from the first sub spacer layer 192.

The second sub spacer layer 194 may be formed between the first sub spacer layer 192 and the third sub spacer layer 196. For example, the second sub spacer layer 194 may include, for example, a nitride layer, specifically SiN, but aspects of the present inventive concept are not limited thereto.

The second sub spacer layer 194 may prevent the first sub spacer layer 192 from being etched in a wet etching process to be described later (for example, a wet etching process using high selectivity phosphoric acid ($H_3PO_4$) and 1000:1 diluted hydrofluoric acid (HF)). The thickness of the second sub spacer layer 194 may be greater than the thickness of the first sub spacer layer 192. The thickness of the second sub spacer layer 194 may be 20 Å, but aspects of the present inventive concept are not limited thereto.

The third sub spacer layer 196 may be formed on the second sub spacer layer 194. For example, the third sub spacer layer 196 may be conformally formed along the second sub spacer layer 194. For example, the third sub spacer layer 196 may include, for example, an oxide layer, specifically $SiO_2$, but aspects of the present inventive concept are not limited thereto.

The third sub spacer layer 196 may prevent the second sub spacer layer 194 from being etched in a wet etching process to be described later (for example, a wet etching process using high selectivity phosphoric acid ($H_3PO_4$) and 1000:1 diluted hydrofluoric acid (HF)). A thickness of the third sub spacer layer 196 may be greater than the thickness of the first sub spacer layer 192. For example, the thickness of the third sub spacer layer 196 may be 20 Å, but aspects of the present inventive concept are not limited thereto.

Figure 22:
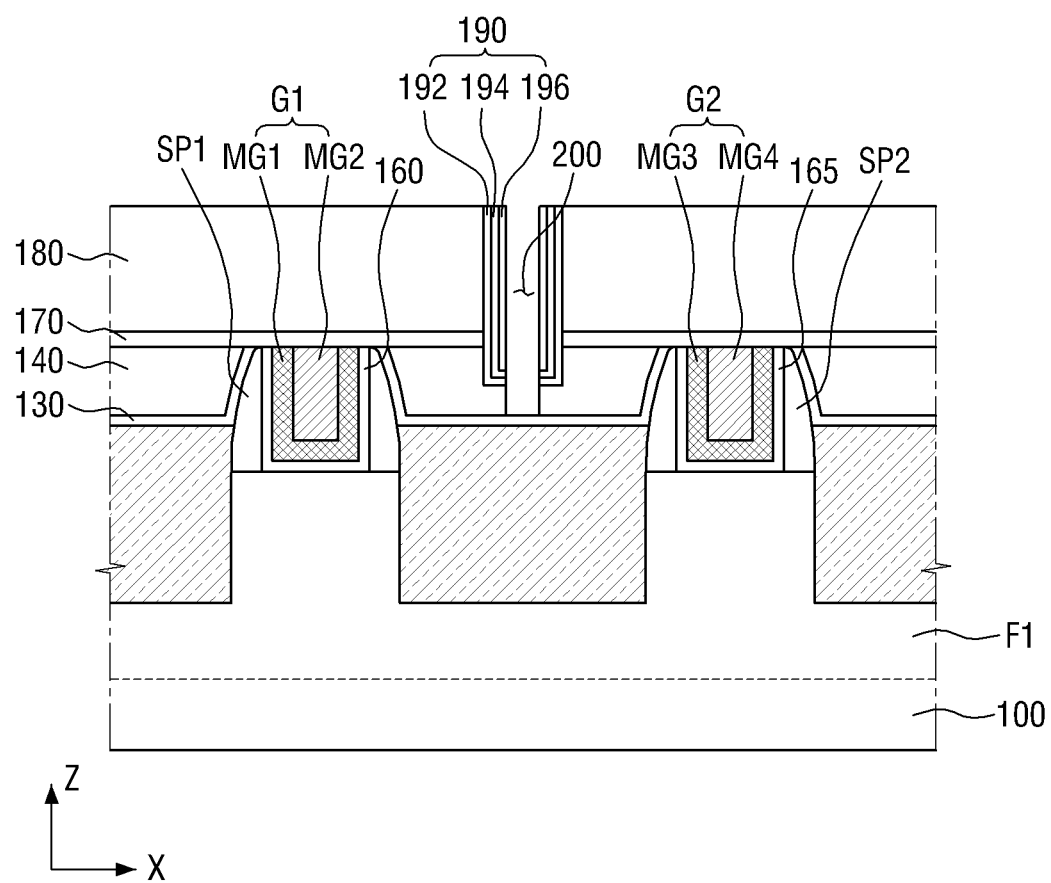

Referring to FIG. 22, a portion of the spacer layer 190 positioned on the second interlayer insulation layer 180 and a portion of the spacer layer 190 adjacent to a top portion of the source/drain SD may be etched.

For example, the portion of the spacer layer 190 positioned on the second interlayer insulation layer 180 is etched to expose a top surface of the second interlayer insulation layer 180, and the portion of the spacer layer 190 adjacent to a top portion of the source/drain SD and a portion of the first interlayer insulation layer 140 are etched to expose the first etch stop layer 130.

A modified source/drain contact via hole 200 may be formed by the etching process for removing the portions of the spacer layer 190.

The etch process of the spacer layer 190 may include, for example, a dry etching process, but aspects of the present inventive concept are not limited thereto.

Figure 23:
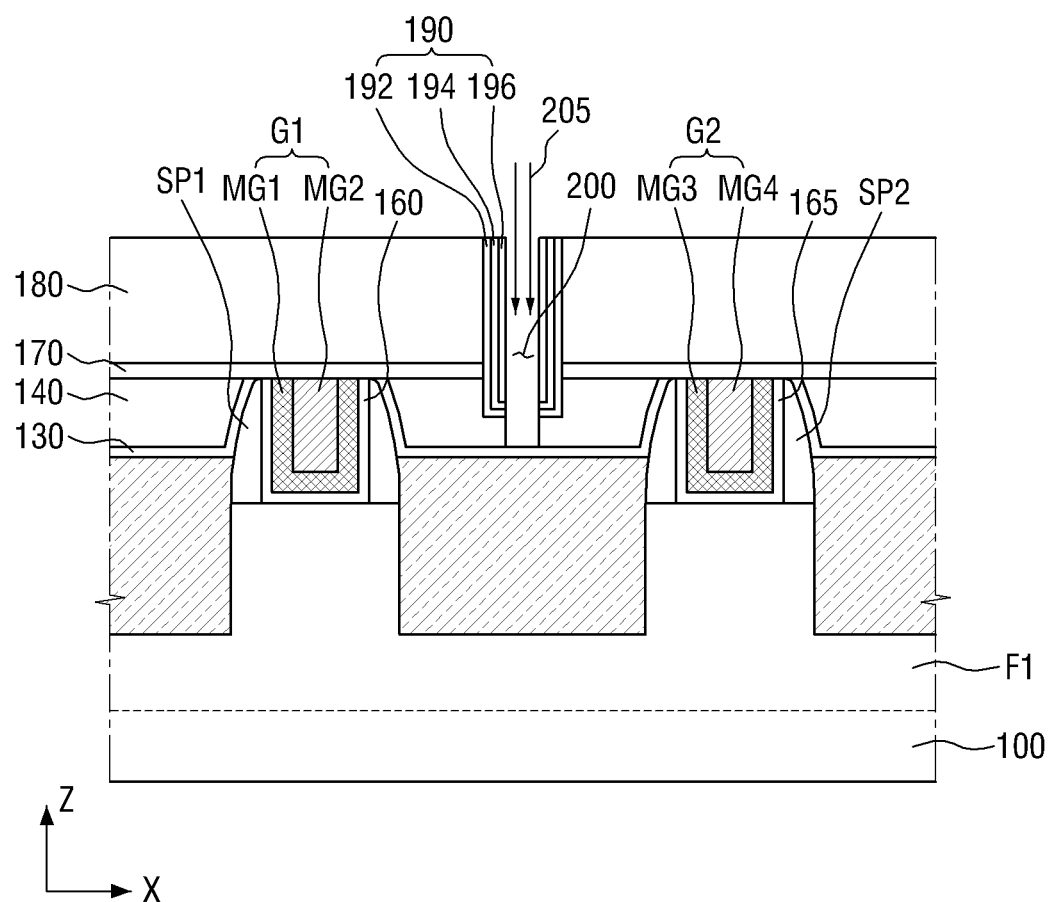

Referring to FIG. 23, an ion implantation process 205 may be performed on the exposed first etch stop layer 130.

For example, the performing of the ion implantation process 205 may include implanting at least one ion of, for example, F, Ge or Ar. As the result of the ion implantation process 205, the implanted ion may be diffused into not only the exposed first etch stop layer 130 but also a portion of the exposed first interlayer insulation layer 140 around the first etch stop layer 130.

For example, the ion implantation process 205 is performed, thereby making the first etch stop layer 130 and the first interlayer insulation layer 140 relative to the spacer layer 190 have wet etching selectivity of about 5:1.

Figure 24:
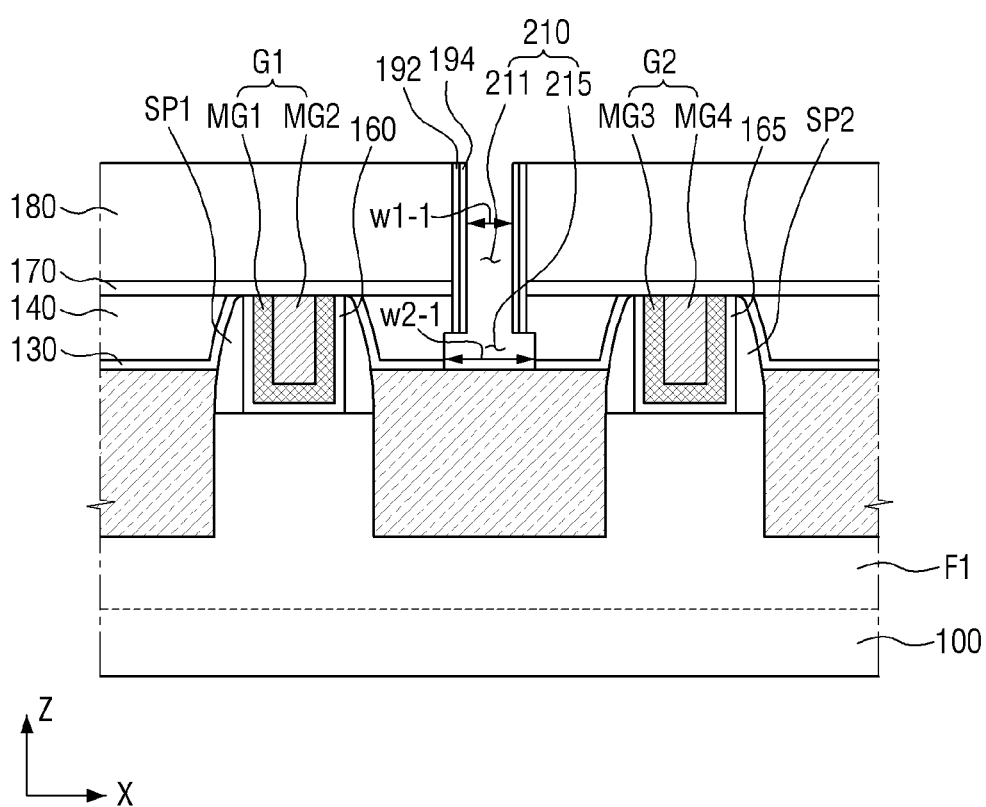

Referring to FIG. 24, a source/drain contact via hole 210 may be formed by a wet etching process (for example, a wet etching process using high selectivity phosphoric acid ($H_3PO_4$) and 1000:1 diluted hydrofluoric acid (HF)).

For example, the wet etching process using the high selectivity phosphoric acid ($H_3PO_4$) and the 1000:1 diluted hydrofluoric acid (HF) is performed to etch the first etch stop layer 130, thereby exposing the source/drain SD, and a portion of the first interlayer insulation layer 140 positioned under the spacer layer 190 is undercut, thereby removing the third sub spacer layer 196.

The high selectivity phosphoric acid ($H_3PO_4$) may have an etching selectivity ratio of about 20:1 with respect to a nitride layer relative to an oxide layer. Accordingly, the high selectivity phosphoric acid ($H_3PO_4$) may mainly etch the nitride layer and the 1000:1 diluted hydrofluoric acid (HF) may mainly etch the oxide layer. The first etch stop layer 130, a portion of the first interlayer insulation layer 140 positioned under the spacer layer 190 and the third sub spacer layer 196 positioned on the outermost part of the spacer layer 190 may be etched by a wet etching process by a wet etching process using the high selectivity phosphoric acid ($H_3PO_4$) and the 1000:1 diluted hydrofluoric acid (HF).

For example, the ion implantation process (205 of FIG. 23) and the wet etching process using the high selectivity phosphoric acid ($H_3PO_4$) and the 1000:1 diluted hydrofluoric acid (HF) may remove the first etch stop layer 130 covering a top surface of the source/drain SD without causing a damage to a profile of the source/drain SD.

The source/drain contact via hole 210 formed by the wet etching process may include a first via hole 211 and a second via hole 215 positioned between the source/drain SD and the first via hole 211.

In example embodiments, a width W1-1 of the first via hole 211 in the first direction X and a width W2-1 of the second via hole 215 in the first direction X may be different from each other at a boundary surface between the first via hole 211 and the second via hole 215. For example, the wet etching selectivity ratio of the first etch stop layer 130 and the first interlayer insulation layer 140 relative to the spacer layer 190 becomes about 5:1 as the result of the ion implantation process, so that the width W2-1 of the second via hole 215 in the first direction X becomes greater than the width W1-1 of the first via hole 211 in the first direction X.

As shown in FIG. 24, in the course of forming the second via hole 215, a lower portion of the first sub spacer layer 192 and a lower portion of the second sub spacer layer 194 may also be partially removed. Thus, a bottom surface of the second via hole 215 may fully vertically overlap a bottom surface of each spacer layer of the first and second sub spacer layers 192 and 194.

In example embodiments, the width W2-1 of the second via hole 215 is greater than the sum of the width W1-1 of the first via hole 211, a width W3-1 of the first sub spacer layer 192 in the first direction X, and a width W4-1 of the second sub spacer layer 194 in the first direction X.

A source/drain contact is formed to fill the source/drain contact via hole 210, thereby fabricating the semiconductor device 1 shown in FIGS. 2A and 3A. At the time of forming the source/drain contact, a silicide layer may also be formed in the second via hole 215.

Figure 25:
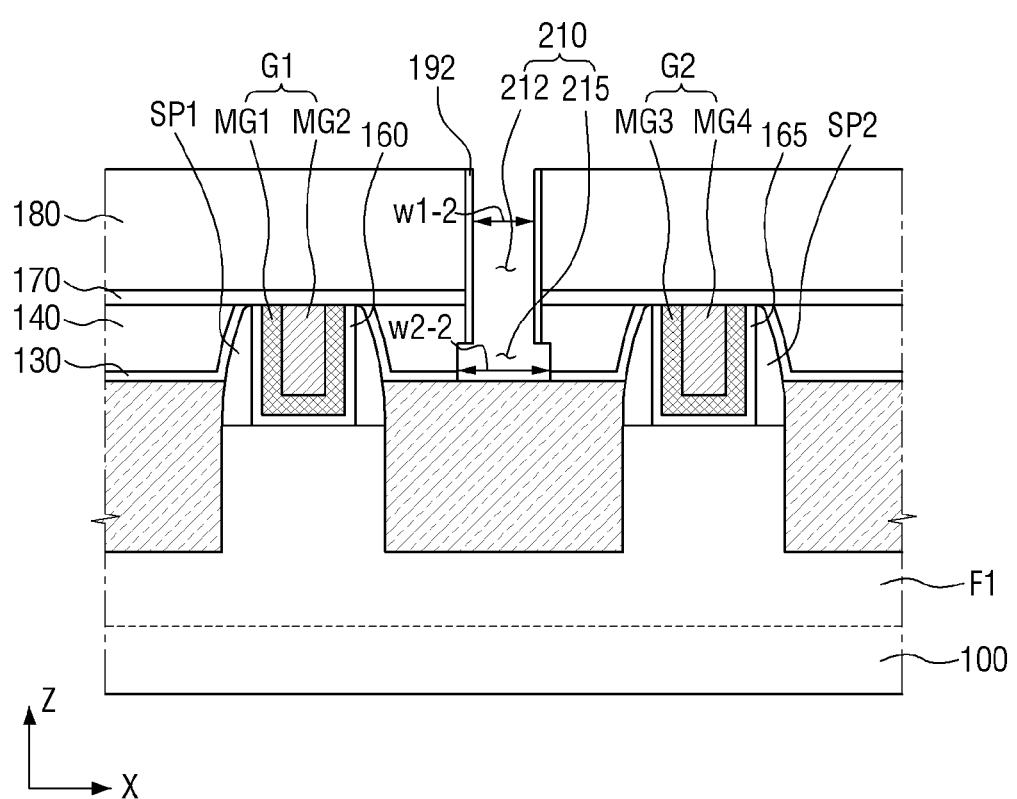

When the second sub spacer layer 194 is removed by the wet etching process shown in FIG. 25 and only the first sub spacer layer 192 remains, a source/drain contact may be formed to fill the source/drain contact via hole 210, thereby fabricating the semiconductor device 1 shown in FIGS. 2A and 3B.

Referring to FIG. 25, the wet etching process shown in FIG. 24 is applied to a spacer layer 190 having an ON structure.

When only the first sub spacer layer 192 remains as the result of the wet etching process shown in FIG. 24, a width W1-2 of a first via hole 212 in the first direction X, as shown in FIG. 25, may be greater than the width W1-1 of the first via hole 211 in the first direction X, as shown in FIG. 24.

A source/drain contact may also be formed to fill the source/drain contact via hole 210, thereby fabricating the semiconductor device 1 shown in FIGS. 2A and 3B.

Hereinafter, a method for fabricating the semiconductor device shown in FIG. 6 will be described with reference to FIG. 26. However, the method for fabricating the semiconductor device shown in FIG. 6 is substantially the same as the method for fabricating the semiconductor device shown in FIG. 1 in view of process steps shown FIGS. 8 to 23, and descriptions thereof will not be given.

Figure 26:
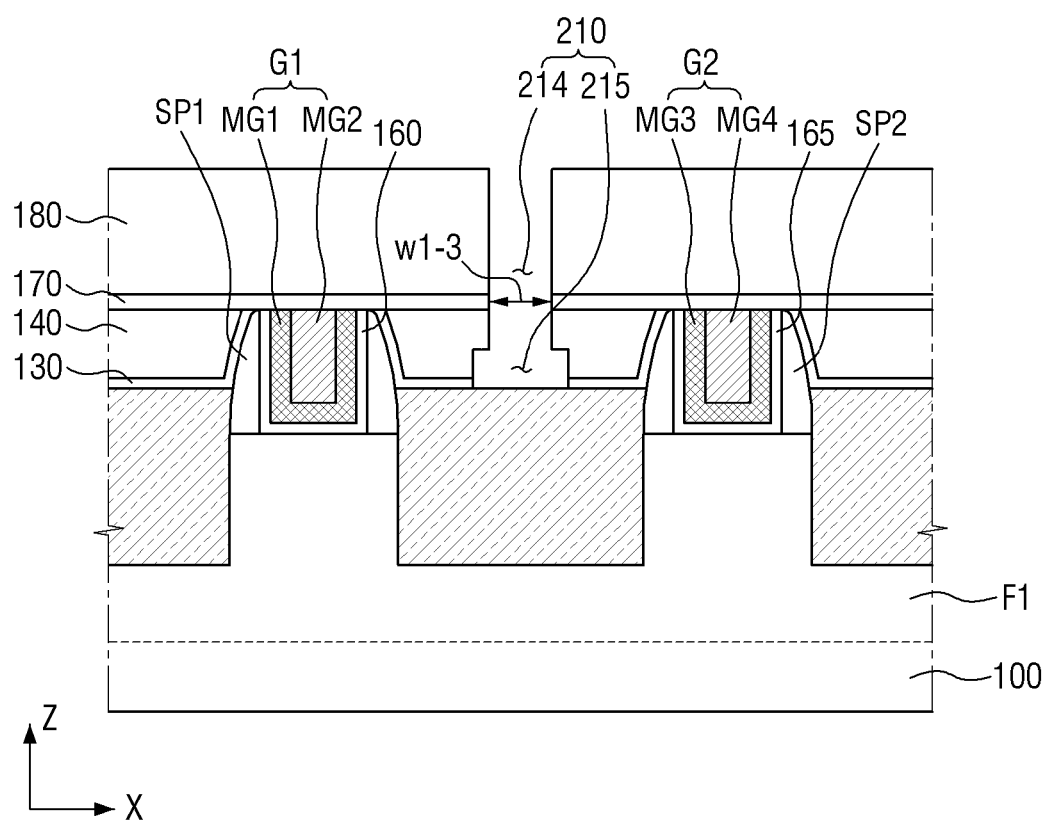
FIG. 26 illustrates an intermediate process step in a method for fabricating the semiconductor device shown in FIG. 6 according to example embodiments.

FIG. 26 illustrates an intermediate process step in a method for fabricating the semiconductor device shown in FIG. 6 according to example embodiments.

Referring to FIG. 26, after performing the ion implantation process 205 shown in FIG. 23, the source/drain contact via hole 210 may be formed by a wet etching process by a wet etching process using high selectivity phosphoric acid ($H_3PO_4$) and 1000:1 diluted hydrofluoric acid (HF).

As shown in FIG. 26, the spacer layer (190 of FIG. 23) is completely removed through the wet etching process using the high selectivity phosphoric acid ($H_3PO_4$) and the 1000:1 diluted hydrofluoric acid (HF).

Since the spacer layer (190 of FIG. 23) is completely removed, a width W1-3 of a first via hole 214 ranging in the first direction X, as shown in FIG. 26, may be greater than the width W1-1 of the first via holes 211 or the width W1-2 of the first via hole 212 in the first direction X, as shown in FIGS. 24 and 25.

A source/drain contact may also be formed to fill the source/drain contact via hole 210, thereby fabricating the semiconductor device 2 shown in FIG. 6.

Figure 27:
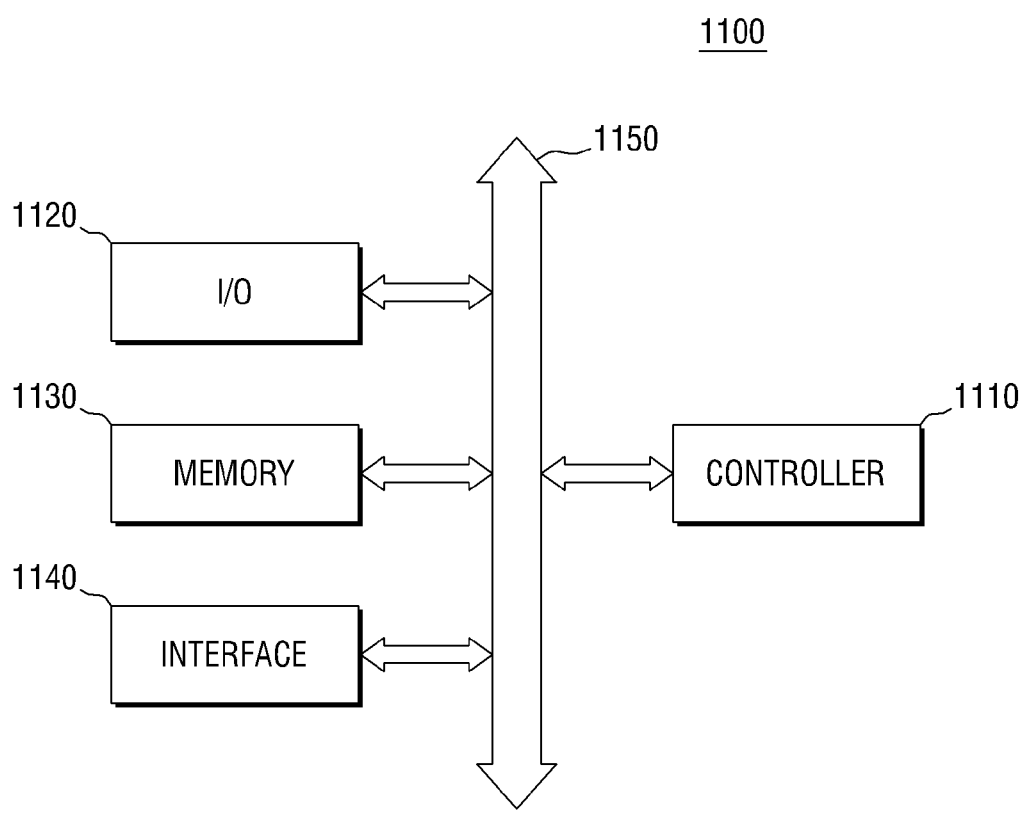
FIG. 27 is a block diagram of an electronic system including semiconductor devices according to certain embodiments.

FIG. 27 is a block diagram of an electronic system including semiconductor devices according to certain embodiments.

Referring to FIG. 27, the electronic system 1100 may include a controller 1110, an input/output unit (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of, for example, a microprocessor, a digital signal processor, a microcontroller, and logic units capable of functions similar to those of the disclosed devices. The I/O) unit 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as a working memory for improving the operation of the controller 1110. The semiconductor devices 1, 2 and 3 according to some embodiments of the present inventive concept may be provided in the memory device 1130 or may be provided as some components of the controller 1110 or the I/O 1120.

The electronic system 1100 may be applied to, for example, a personal digital assistant (PDA), a portable computer, a web tablet, a wireless phone, a mobile phone, a digital music player, a memory card, or any type of electronic device capable of transmitting and/or receiving information in a wireless environment.

Figure 28:
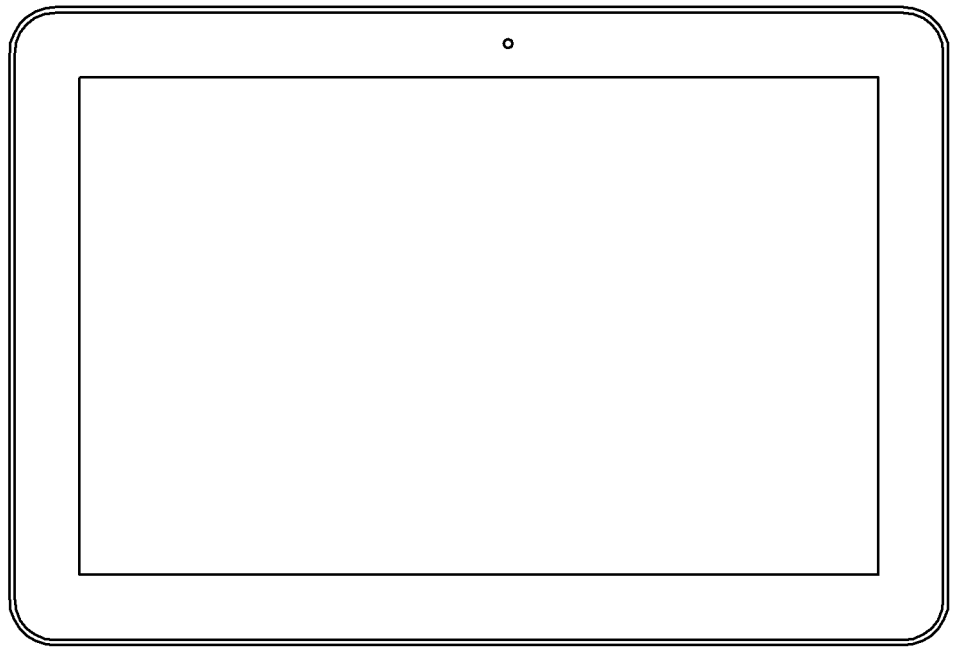
FIGS. 28 to 30 illustrate exemplary electronic systems to which semiconductor devices according to certain embodiments can be applied.
Figure 29:
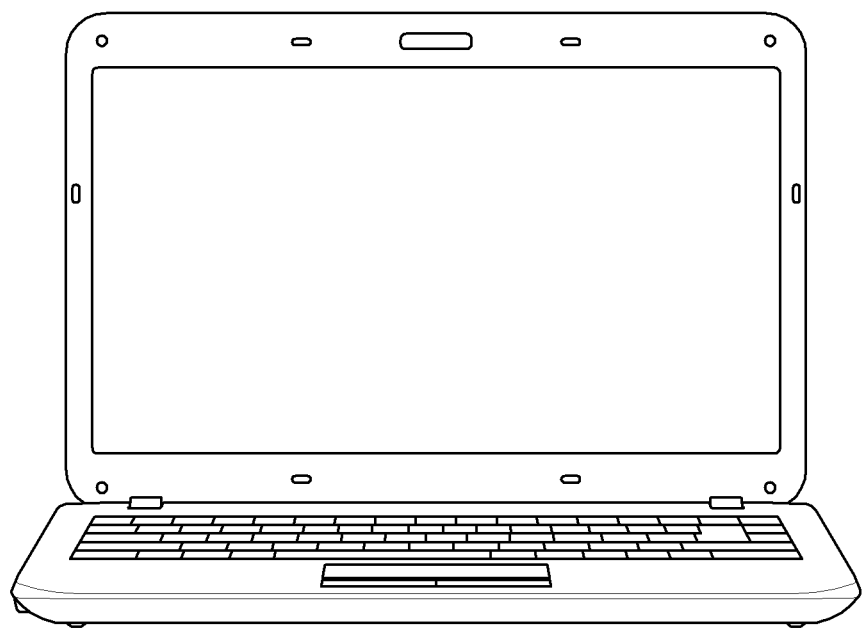
Figure 30:
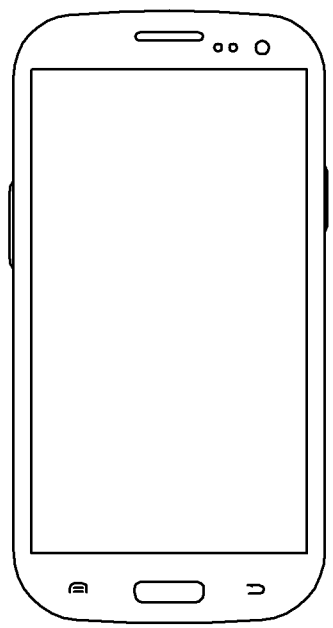

FIGS. 28 to 30 illustrate exemplary electronic systems to which semiconductor devices according to certain embodiments can be applied.

FIG. 28 illustrates a tablet PC (1200) including at least one of the semiconductor devices 1, 2 or 3 according to certain embodiments, FIG. 29 illustrates a notebook computer (1300) including at least one of the semiconductor devices 1, 2 or 3 according to certain embodiments, and FIG. 30 illustrates a smart phone (1400) including at least one of the semiconductor devices 1, 2 or 3 according to certain embodiments. In addition, the semiconductor devices 1, 2 and 3 according to some embodiments of the present inventive concept may also be applied to other IC devices not illustrated herein. For example, in the above-described embodiments, the tablet PC 1200, the notebook computer 1300 and the smart phone 1400 have been exemplified as electronic devices according to the embodiments of the present inventive concept, but aspects of the present inventive concept are not limited thereto. In some embodiments of the present inventive concept, an electronic device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the present inventive concept has been particularly shown and described with reference to exemplary embodiments thereof, it will be understood by those of ordinary skill in the art that various changes in form and details may be made therein without departing from the spirit and scope of the present inventive concept. It is therefore desired that the present embodiments be considered in all respects as illustrative and not restrictive, reference being made to the appended claims rather than the foregoing description to indicate the scope of the invention.

What is claimed is:

1. A semiconductor device comprising:
   an active fin formed to extend in a first direction;
   a gate formed on the active fin and extending in a second direction crossing the first direction;
   a source/drain formed on upper portions of the active fin and disposed at one side of the gate;
   an interlayer insulation layer covering the gate and the source/drain;
   a source/drain contact passing through the interlayer insulation layer to be connected to the source/drain and including a first contact region and a second contact region positioned between the source/drain and the first contact region; and
   a spacer layer formed between the first contact region and the interlayer insulation layer,
   wherein a width of the second contact region of the source/drain contact in the first direction is greater than the sum of a width of the first contact region of the source/drain contact in the first direction and a width of the spacer layer in the first direction,
   wherein the spacer layer includes an insulation layer, and contacts the first contact region and the interlayer insulation layer,
   wherein the interlayer insulation layer includes a first part and a second part formed under the first part, and
   wherein on the basis of a particular line perpendicular to a bottom surface of the interlayer insulation layer, a width of the first part in the first direction from the particular line to a first surface of the spacer layer is greater than a width of the second part in the first direction from the particular line to a first surface of the second contact region.

2. The semiconductor device of claim 1, wherein a bottom surface of the second contact region fully overlaps a bottom surface of the spacer layer.

3. The semiconductor device of claim 1, wherein the spacer layer includes first and second spacer layers extending along a first sidewall of the first contact region, and
   wherein the first spacer layer is formed between the first contact region and the second spacer layer.

4. The semiconductor device of claim 3, wherein the spacer layer further includes third and fourth spacer layers extending along a second sidewall opposite to the first sidewall of the first contact region, and
   wherein the third spacer layer is formed between the first contact region and the fourth spacer layer.

5. The semiconductor device of claim 3, wherein the first spacer layer includes SiN.

6. The semiconductor device of claim 1, wherein a top of the second part is positioned on the same plane with a top surface of the second contact region.

7. The semiconductor device of claim 1, further comprising:
   an etch stop layer formed on a top surface of the source/drain,
   wherein the second contact region is formed in an opening of the etch stop layer.

8. The semiconductor device of claim 1, wherein the second contact region includes a silicide layer.

9. The semiconductor device of claim 1, wherein the spacer layer includes a first spacer layer extending along a first sidewall of the first contact region and a second spacer layer extending along a second sidewall opposite to the first sidewall of the first contact region,
   wherein the first spacer layer includes a first surface contacting the first contact region and a second surface contacting the interlayer insulation layer, and
   wherein the second spacer layer includes a first surface contacting the first contact region and a second surface contacting the interlayer insulation layer.

10. The semiconductor device of claim 1, wherein the second part is adjacent to a top portion of the source/drain and is positioned between the gate and the source/drain contact.

11. A semiconductor device comprising:
    an active fin formed to extend in a first direction;
    a gate formed on the active fin and extending in a second direction crossing the first direction;
    a source/drain formed on upper portions of the active fin and disposed at one side of the gate;
    an interlayer insulation layer covering the gate and the source/drain;
    a source/drain contact passing through the interlayer insulation layer to be connected to the source/drain and including a first contact region and a second contact region positioned between the source/drain and the first contact region; and
    a spacer layer formed between the first contact region and the interlayer insulation layer,
    wherein a width of the second contact region of the source/drain contact in the first direction is greater than the sum of a width of the first contact region of the source/drain contact in the first direction and a width of the spacer layer in the first direction,
    wherein the spacer layer includes an insulation layer, and contacts the first contact region and the interlayer insulation layer,
    wherein the spacer layer includes a first spacer layer extending along a first sidewall of the first contact region and a second spacer layer extending along a second sidewall opposite to the first sidewall of the first contact region,
    wherein the first spacer layer includes a first surface contacting the first contact region and a second surface contacting the interlayer insulation layer,
    wherein the second spacer layer includes a first surface contacting the first contact region and a second surface contacting the interlayer insulation layer,
    wherein the second contact region includes a first surface and a second surface opposite to the first surface of the second contact region in the first direction,
    wherein a distance from the first sidewall of the first contact region to the first surface of the second contact region in the first direction is greater than a distance from the first sidewall of the first contact region to the second surface of the first spacer layer in the first direction, and wherein a distance from the second sidewall of the first contact region to the second surface of the second contact region in the first direction is greater than a distance from the second sidewall of the first contact region to the second surface of the second spacer layer in the first direction.

12. The semiconductor device of claim 11, wherein the second contact region includes a silicide layer.

13. The semiconductor device of claim 11, wherein a bottom surface of the second contact region fully overlaps a bottom surface of the spacer layer.

14. The semiconductor device of claim 11, further comprising:
an etch stop layer formed on a top surface of the source/drain,
wherein the second contact region is formed in an opening of the etch stop layer.

15. A semiconductor device comprising:
an active fin formed to extend in a first direction;
a gate formed on the active fin and extending in a second direction crossing the first direction;
a source/drain formed on upper portions of the active fin and disposed at one side of the gate;
an interlayer insulation layer covering the gate and the source/drain;
a source/drain contact passing through the interlayer insulation layer to be connected to the source/drain and including a first contact region and a second contact region positioned between the source/drain and the first contact region; and
a spacer layer formed between the first contact region and the interlayer insulation layer,
wherein a width of the second contact region of the source/drain contact in the first direction is greater than the sum of a width of the first contact region of the source/drain contact in the first direction and a width of the spacer layer in the first direction,
wherein the spacer layer includes an insulation layer, and contacts the first contact region and the interlayer insulation layer,
wherein the spacer layer includes first and second spacer layers extending along a first sidewall of the first contact region,
wherein the first spacer layer is formed between the first contact region and the second spacer layer,
wherein the spacer layer further includes third and fourth spacer layers extending along a second sidewall opposite to the first sidewall of the first contact region,
wherein the third spacer layer is formed between the first contact region and the fourth spacer layer,
wherein the second contact region includes a first surface and a second surface opposite to the first surface of the second contact region in the first direction,
wherein a distance from the first sidewall of the first contact region to the first surface of the second contact region in the first direction is greater than a distance from the first sidewall of the first contact region to a first surface of the second spacer layer contacting the interlayer insulation layer in the first direction, and
wherein a distance from the second sidewall of the first contact region to the second surface of the second contact region in the first direction is greater than a distance from the second sidewall of the first contact region to a first surface of the fourth spacer layer contacting the interlayer insulation layer in the first direction.

16. The semiconductor device of claim 15, wherein the second contact region includes a silicide layer.

17. The semiconductor device of claim 15, wherein a bottom surface of the second contact region fully overlaps a bottom surface of the spacer layer.

18. The semiconductor device of claim 15, further comprising:
an etch stop layer formed on a top surface of the source/drain,
wherein the second contact region is formed in an opening of the etch stop layer.

* * * * *